(12) United States Patent
Lee et al.

(10) Patent No.: US 12,520,632 B2
(45) Date of Patent: Jan. 6, 2026

(54) LIGHT EMITTING ELEMENT AND DISPLAY DEVICE INCLUDING THE SAME

(71) Applicant: Samsung Display Co., LTD., Yongin-si (KR)

(72) Inventors: Jong Jin Lee, Seongnam-si (KR); Si Sung Kim, Seoul (KR); Hyung Seok Kim, Hwaseong-si (KR); Dong Eon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 582 days.

(21) Appl. No.: 17/969,072

(22) Filed: Oct. 19, 2022

(65) Prior Publication Data

US 2023/0207740 A1    Jun. 29, 2023

(30) Foreign Application Priority Data

Dec. 27, 2021   (KR) .......................... 10-2021-0188312

(51) Int. Cl.
*H10H 20/84*   (2025.01)
*H01L 25/16*   (2023.01)
(Continued)

(52) U.S. Cl.
CPC ........... *H10H 20/84* (2025.01); *H01L 25/167* (2013.01); *H10H 20/831* (2025.01);
(Continued)

(58) Field of Classification Search
CPC .. H10H 20/84; H10H 20/831; H10H 20/0133; H10H 20/018; H10H 20/824; H01L 25/167
See application file for complete search history.

(56) References Cited

U.S. PATENT DOCUMENTS 6,410,940 B1 * 6/2002 Jiang ....................... H10F 39/80
438/22
9,166,106 B2 * 10/2015 Svensson .......... H01L 21/02603

FOREIGN PATENT DOCUMENTS

JP          2009-135466    6/2009
KR    10-2005-0086390     8/2005
(Continued)

OTHER PUBLICATIONS

Dong-Ju Seo et al., "Efficiency improvement in InGaN-based solar cells by indium tin oxide nano dots covered with ITO films", Optics Express, vol. 20, No. S6, Nov. 5, 2012, 6 total pages.

*Primary Examiner* — Jay C Kim
*Assistant Examiner* — Woo K Lee
(74) *Attorney, Agent, or Firm* — Womble Bond Dickinson (US) LLP

(57) ABSTRACT

A light emitting element includes a light emitting element core extending in a direction and including first and second semiconductor layers and an element active layer disposed between the first and second semiconductor layers. The light emitting element includes an element electrode layer on the second semiconductor layer of the light emitting element core, and an element insulating film surrounding a side surface of the light emitting element core and a side surface of the element electrode layer. The element electrode layer overlaps the second semiconductor layer in the direction the light emitting element core extends, an area of the element electrode layer in plan view is smaller than an area of the second semiconductor layer in plan view, and the element insulating film completely exposes a surface of the element electrode layer, the surface being opposite to another surface of the element electrode layer facing the second semiconductor layer.

20 Claims, 23 Drawing Sheets

(51) Int. Cl.
*H10H 20/01* (2025.01)
*H10H 20/824* (2025.01)
*H10H 20/831* (2025.01)

(52) U.S. Cl.
CPC ....... *H10H 20/0133* (2025.01); *H10H 20/018* (2025.01); *H10H 20/824* (2025.01)

(56) References Cited

FOREIGN PATENT DOCUMENTS

| KR | 10-2007-0046224 | 5/2007 | | |
|----|-----------------|--------|---|---|
| KR | 10-2016-0059569 | 5/2016 | | |
| KR | 10-2019-0050201 | 5/2019 | | |
| KR | 10-2021-0032618 | 3/2021 | | |
| WO | WO-2020149529 A1 * | 7/2020 | ........... | H01L 27/156 |

* cited by examiner

ED: 30, 37, 38
30: 31, 32, 33
32: 32US, 32BS, 32SS
37: 37US, 37BS, 37SS

FIG. 18
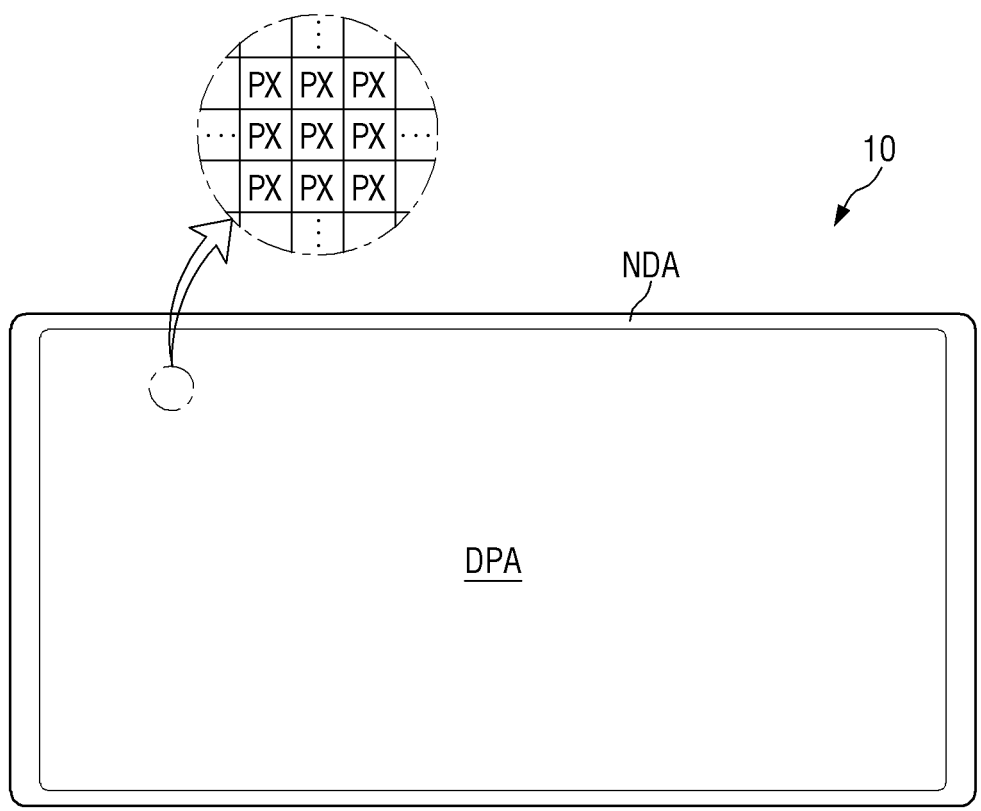
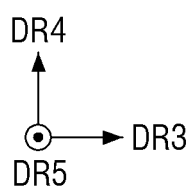

LIGHT EMITTING ELEMENT AND DISPLAY DEVICE INCLUDING THE SAME

CROSS-REFERENCE TO RELATED APPLICATION(S)

This application claims priority to and benefits of Korean Patent Application No. 10-2021-0188312 under 35 U.S.C. 119, filed on Dec. 27, 2021 in the Korean Intellectual Property Office (KIPO), the entire contents of which are herein incorporated by reference.

BACKGROUND

1. Technical Field

The disclosure relates to a light emitting element and a display device including the same.

2. Description of the Related Art

The importance of display devices has increased with the development of multimedia. Accordingly, various types of display devices such as an organic light emitting display (OLED) and a liquid crystal display (LCD) have been used for displaying images.

A display panel may include light emitting elements, which may be light emitting diodes (LEDs). Examples of light emitting diodes include an organic light emitting diode (OLED) that uses an organic material as a light emitting material, an inorganic light emitting diode that uses an inorganic material as a light emitting material, and the like.

SUMMARY

Aspects of the disclosure provide a light emitting element in which a side surface of a second semiconductor layer positioned adjacent to an element electrode layer may be prevented from being exposed even in case that an element insulating film is over-etched in processes of manufacturing the light emitting element by making an area of a lower surface of the element electrode layer smaller than that of an upper surface of the second semiconductor layer to expose the upper surface of the second semiconductor layer.

Aspects of the disclosure also provide a display device having improved luminous efficiency by including such light emitting elements.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a light emitting element may include a light emitting element core extending in a direction and including a first semiconductor layer, a second semiconductor layer disposed on the first semiconductor layer, and an element active layer disposed between the first semiconductor layer and the second semiconductor layer. The light emitting element may include an element electrode layer disposed on the second semiconductor layer of the light emitting element core, and an element insulating film surrounding a side surface of the light emitting element core and a side surface of the element electrode layer. The element electrode layer may overlap the second semiconductor layer in the direction the light emitting element core extends, an area of the element electrode layer in plan view may be smaller than an area of the second semiconductor layer in plan view, and the element insulating film may completely expose a surface of the element electrode layer, the surface being opposite to another surface of the element electrode layer facing the second semiconductor layer.

In an embodiment, the area of the element electrode layer in plan view may be in a range of 75% to 95% of the area of the second semiconductor layer in plan view.

In an embodiment, the element insulating film surrounding the element electrode layer may have an outer peripheral surface inclined with respect to the direction the light emitting element core extends.

In an embodiment, an inclination angle of the outer peripheral surface of the element insulating film surrounding the element electrode layer may be in a range of 60° or less.

In an embodiment, a surface of the second semiconductor layer facing the element electrode layer may include a first region that overlaps the another surface of the element electrode layer, and a second region that may not overlap the another surface of the element electrode layer, and the element insulating film may cover the second region of the surface of the second semiconductor layer.

In an embodiment, the element insulating film may be in direct contact with the second region of the surface of the second semiconductor layer.

In an embodiment, the element insulating film may include a first region surrounding the side surface of the light emitting element core, and a second region surrounding the side surface of the element electrode layer, and the first region of the element insulating film and the second region of the element insulating film may be physically connected to each other.

According to an embodiment of the disclosure, a light emitting element may include a light emitting element core extending in a direction and including a first semiconductor layer, a second semiconductor layer disposed on the first semiconductor layer, and an element active layer disposed between the first semiconductor layer and the second semiconductor layer. The light emitting element may include an element electrode layer disposed on the second semiconductor layer of the light emitting element core, and an element insulating film including a first region surrounding a side surface of the light emitting element core, and a second region surrounding a side surface of the element electrode layer. The second region of the element insulating film may include an outer peripheral surface inclined with respect to the direction the light emitting element core extends, and an inclination angle of the outer peripheral surface of the second region of the element insulating film may be in a range of 60° or less.

In an embodiment, the second region of the element insulating film may completely expose a surface of the element electrode layer, the surface being opposite to another surface of the element electrode layer facing the second semiconductor layer.

In an embodiment, the second region of the element insulating film may expose a portion of the side surface of the element electrode layer, and the side surface of the element electrode layer exposed by the second region of the element insulating film may be disposed adjacent to the surface of the element electrode layer.

In an embodiment, the first region of the element insulating film may completely surround a side surface of the element active layer and a side surface of the second semiconductor layer.

In an embodiment, the element electrode layer may overlap the second semiconductor layer in the direction the light emitting element core extends, and an area of the element electrode layer in plan view may be smaller than an area of the second semiconductor layer in plan view.

In an embodiment, the area of the element electrode layer in plan view may be in a range of 75% to 95% of the area of the second semiconductor layer in plan view.

In an embodiment, a surface of the second semiconductor layer facing the element electrode layer may include a first region that overlaps the element electrode layer, and a second region that may not overlap the element electrode layer, and the second region of the element insulating film may cover the second region of the surface of the second semiconductor layer.

In an embodiment, the second region of the element insulating film may be in direct contact with the second region of the surface of the second semiconductor layer.

According to an embodiment of the disclosure, a display device may include a first electrode and a second electrode that are disposed on a substrate and spaced apart from each other, and a light emitting element disposed between the first electrode and the second electrode. The light emitting element may include a light emitting element core extending in a direction and including a first semiconductor layer, a second semiconductor layer disposed on the first semiconductor layer, and an element active layer disposed between the first semiconductor layer and the second semiconductor layer. The light emitting element may include an element electrode layer disposed on the second semiconductor layer of the light emitting element core, and an element insulating film surrounding a side surface of the light emitting element core and a side surface of the element electrode layer. The first semiconductor layer, the element active layer, and the second semiconductor layer may be sequentially disposed in the direction the light emitting element core extends, the element electrode layer may overlap the second semiconductor layer in the direction the light emitting element core extends, and an area of the element electrode layer in plan view may be smaller than an area of the second semiconductor layer in plan view, and the element insulating film may completely expose a surface of the element electrode layer, the surface being opposite surface to another surface of the element electrode layer facing the second semiconductor layer.

In an embodiment, the area of the element electrode layer in plan view may be in a range of 75% to 95% of the area of the second semiconductor layer in plan view.

In an embodiment, the element insulating film surrounding the element electrode layer may have an outer peripheral surface inclined with respect to the direction the light emitting element core extends.

In an embodiment, an inclination angle of the outer peripheral surface of the element insulating film surrounding the element electrode layer may be in a range of 60° or less.

According to an embodiment of the disclosure, a display device may include a first electrode and a second electrode that are disposed on a substrate and spaced apart from each other, and a light emitting element disposed between the first electrode and the second electrode. The light emitting element may include a light emitting element core extending in the direction and including a first semiconductor layer, a second semiconductor layer disposed on the first semiconductor layer, and an element active layer disposed between the first semiconductor layer and the second semiconductor layer. The light emitting element may include an element electrode layer disposed on the second semiconductor layer of the light emitting element core, and an element insulating film including a first region surrounding a side surface of the light emitting element core, and a second region surrounding a side surface of the element electrode layer. The second region of the element insulating film may include an outer peripheral surface inclined with respect to the direction the light emitting element core extends, and an inclination angle of the outer peripheral surface of the second region of the element insulating film may be in a range of 60° or less.

With the light emitting element according to an embodiment, the element electrode layer may expose an upper surface of the second semiconductor layer by making an area of a lower surface of the element electrode layer smaller than an area of the upper surface of the second semiconductor layer. Accordingly, even in case that the element insulating film is over-etched in processes of manufacturing the light emitting element, a side surface of the second semiconductor layer positioned adjacent to the element electrode layer may be prevented from being exposed.

A display device according to an embodiment may include the light emitting element described above, and thus, display quality may be improved.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which:

FIG. 18 is a schematic plan view of a display device according to an embodiment;

Figure 1:
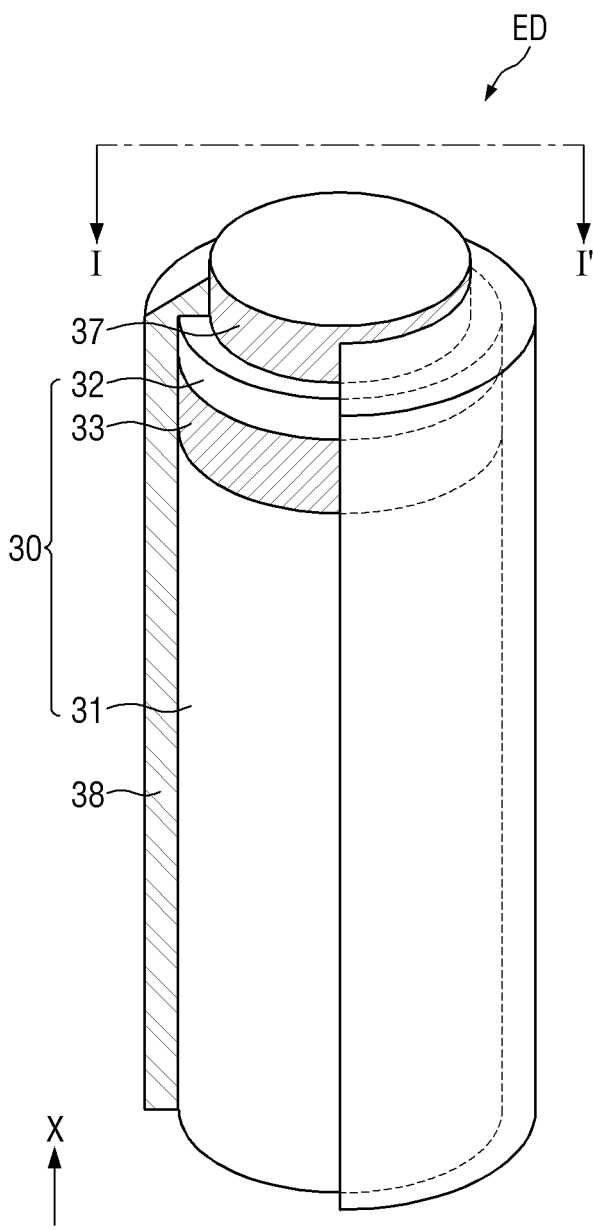
FIG. 1 is a schematic perspective view of a light emitting element according to an embodiment.

DETAILED DESCRIPTION OF THE
EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving may be possible. Each embodiment may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
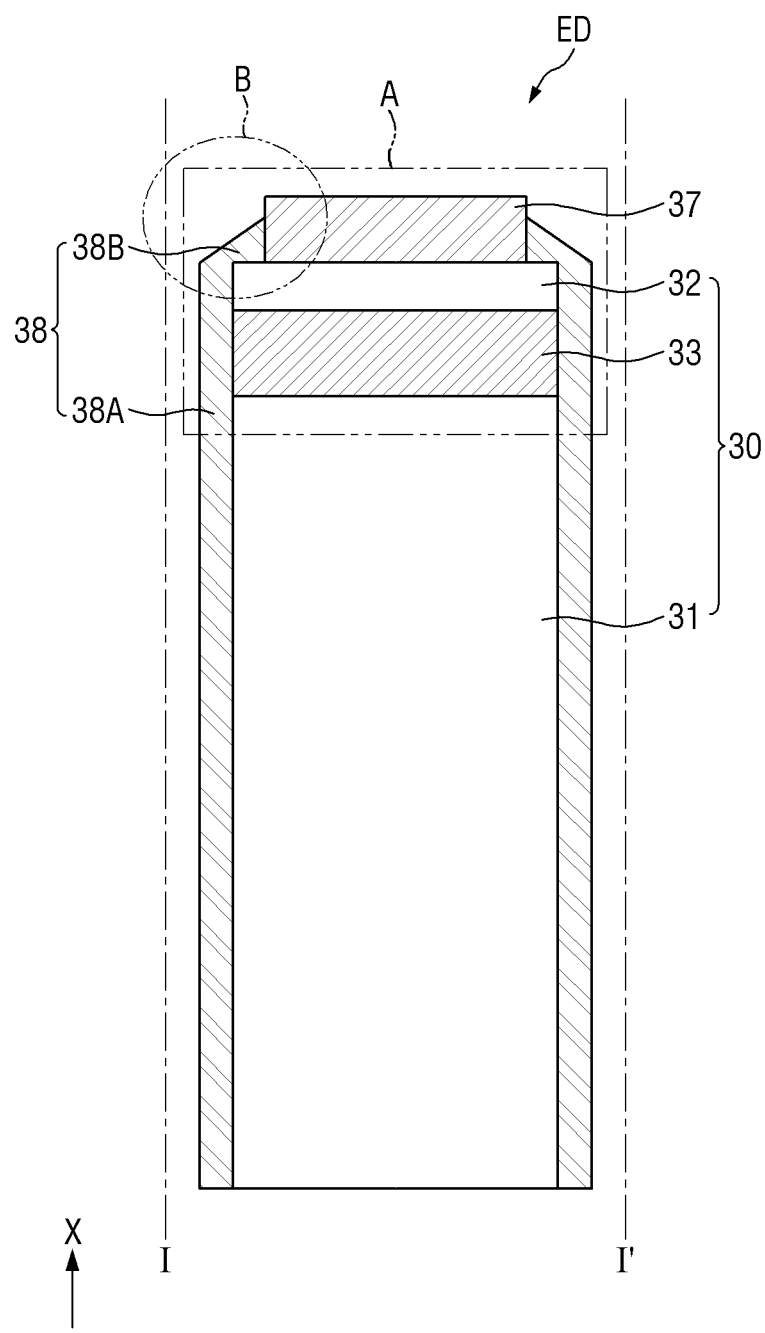
FIG. 2 is a schematic cross-sectional view of the light emitting element illustrating an example taken along line I-I' of FIG. 1.

FIG. 1 is a schematic perspective view of a light emitting element according to an embodiment. FIG. 2 is a schematic cross-sectional view of the light emitting element illustrating an example taken along line I-I' of FIG. 1.

Referring to FIGS. 1 and 2, a light emitting element ED may be a particle type element, and may have a rod or cylindrical shape having an aspect ratio. The light emitting element ED may have a shape in which it extends in a direction X, a length of the light emitting element ED in an extension direction (or a length direction X) may be greater than a diameter of the light emitting element ED, and the aspect ratio of the light emitting element ED may be 6:5 to 100:1, but the disclosure is not limited thereto. For example, the light emitting element ED may have a shape such as a cylindrical shape, a rod shape, a wire shape, or a tube shape or may have a polygonal prismatic shape such as a cubic shape, a rectangular parallelepiped shape, or a hexagonal prismatic shape or have a shape in which it extends in a direction and has partially inclined outer surfaces. Hereinafter, in the drawings for describing a shape of the light emitting element ED, the terms "a direction X", "extension direction X of the light emitting element ED", and "length direction X of the light emitting element ED may be used interchangeably.

The light emitting element ED may have a size of a nanometer scale (1 nm or more and less than 1 μm) to a micrometer scale (1 μm or more and less than 1 mm). In an embodiment, both the length and the diameter of the light emitting element ED may have a size of a nanometer scale or have a size of a micrometer scale. In some other embodiments, the diameter of the light emitting element ED may have a size of a nanometer scale, while the length of the light emitting element ED may have a size of a micrometer scale. In some embodiments, diameters and/or lengths of certain light emitting elements ED may have sizes of a nanometer scale, while diameters and/or lengths of others of the light emitting elements ED may have a size of a micrometer scale.

In an embodiment, the light emitting element ED may be an inorganic light emitting diode. The inorganic light emitting diode may include semiconductor layers. For example, the inorganic light emitting diode may include a first conductivity-type (e.g., n-type) semiconductor layer, a second conductivity-type (e.g., p-type) semiconductor layer, and an active semiconductor layer interposed between the first conductivity-type semiconductor layer and the second conductivity-type semiconductor layer. The active semiconductor layer may receive holes and electrons provided from the first conductivity-type semiconductor layer and the second conductivity-type semiconductor layer, respectively, and the holes and the electrons reaching the active semiconductor layer may be combined with each other to emit light. The inorganic light emitting diode may be aligned between two electrodes in which polarities are formed in case that an electric field is formed in a specific direction between the two electrodes facing each other.

The light emitting element ED may include a light emitting element core 30, an element electrode layer 37, and an element insulating film 38.

The light emitting element core 30 may have a shape in which it extends in a direction X. The light emitting element core 30 may have a rod or cylindrical shape. However, the disclosure is not limited thereto, and the light emitting element core 30 may have a polygonal prismatic shape such as a cubic shape, a rectangular parallelepiped shape, or a hexagonal prismatic shape or have a shape in which it extends in a direction X and has partially inclined outer surfaces.

The light emitting element core 30 according to an embodiment may include semiconductor layers. The semiconductor layers of the light emitting element core 30 may include a first semiconductor layer 31, a second semiconductor layer 32, and an element active layer 33. The first semiconductor layer 31, the element active layer 33, and the second semiconductor layer 32 may be sequentially stacked on each other along a direction X, which may be the length direction of the light emitting element core 30.

Hereinafter, in embodiments describing the light emitting element ED, unless otherwise stated, the term "upper portion" may refer to a side in a direction X and may refer to a side of the light emitting element core 30 on which the element electrode layer 37 may be disposed, and the term "upper surface" may refer to a surface toward a side in a direction X. The term "lower portion" may refer to another side in a direction X opposite to the side in the direction X, and the term "lower surface" may refer to a surface toward the another side in a direction X.

The first semiconductor layer 31 may be doped with a first conductivity-type dopant. The first conductivity-type may be an n-type, and the first conductivity-type dopant may be Si, Ge, Sn, or the like, or a combination thereof. For example, the first semiconductor layer 31 may be an n-type semiconductor. In an embodiment, the first semiconductor layer 31 may be made of n-GaN doped with n-type Si.

The second semiconductor layer 32 may be disposed to be spaced apart from the first semiconductor layer 31 with the element active layer 33 interposed therebetween. The second semiconductor layer 32 may be doped with a second conductivity-type dopant. The second conductivity-type may be a p-type, and the second conductivity-type dopant may be Mg, Zn, Ca, Sr, Ba, or the like, or a combination thereof. For example, the second semiconductor layer 32 may be a p-type semiconductor. In an embodiment, the second semiconductor layer 32 may be made of p-GaN doped with p-type Mg.

It has been illustrated in FIGS. 1 and 2 that each of the first semiconductor layer 31 and the second semiconductor layer 32 is configured as one layer, but the disclosure is not limited thereto. Each of the first semiconductor layer 31 and the second semiconductor layer 32 may further include a larger number of layers, for example, a clad layer or a tensile strain barrier reducing (TSBR) layer, depending on a material included in the element active layer 33.

The element active layer 33 may be disposed between the first semiconductor layer 31 and the second semiconductor layer 32. The element active layer 33 may include a material having a single or multiple quantum well structure. The element active layer 33 may emit light by a combination of electron-hole pairs according to electrical signals applied through the first semiconductor layer 31 and the second semiconductor layer 32.

In some embodiments, the element active layer 33 may have a structure in which semiconductor materials having large band gap energy and semiconductor materials having small band gap energy may be alternately stacked on each other, and may include other Group III to Group V semiconductor materials depending on a wavelength band of emitted light. The light emitted by the element active layer 33 is not limited to light of a blue wavelength band, and in some cases, the element active layer 33 may also emit light of red and green wavelength bands.

The light emitted from the element active layer 33 may be emitted not only to both end surfaces of the light emitting element ED in a direction X, which may be the length direction of the light emitting element ED, but also to a side surface of the light emitting element ED. An emission direction of the light from the element active layer 33 is not limited to one direction.

The element electrode layer 37 may be disposed on the light emitting element core 30. Specifically, the element electrode layer 37 may be disposed on a surface (or an upper surface) of the second semiconductor layer 32 of the light emitting element core 30. The element electrode layer 37 may be directly disposed on the upper surface of the second semiconductor layer 32 to be in contact with the upper surface of the second semiconductor layer 32. The element electrode layer 37 may be an ohmic contact electrode, but is not limited thereto, and may also be a Schottky contact electrode.

In an embodiment, a side surface of the element electrode layer 37 may be aligned inside a side surface of the second semiconductor layer 32. For example, a diameter (or a width) of the element electrode layer 37 may be smaller than a diameter (or a width) of the second semiconductor layer 32 disposed below the element electrode layer 37. The element electrode layer 37 may overlap the second semiconductor layer 32 in a direction X. Accordingly, the second semiconductor layer 32 may completely cover the element electrode layer 37 below the element electrode layer 37, and the element electrode layer 37 may expose at least a portion of the second semiconductor layer 32 in a direction X. A detailed description of a relative arrangement between and diameters of the element electrode layer 37, the second semiconductor layer 32, and the element insulating film 38 will be provided later.

The element electrode layer 37 may be disposed between the second semiconductor layer 32 and electrodes or contact electrodes to serve to decrease resistance, in case that both ends of the light emitting element ED and first and second contact electrodes 710 and 720 (see FIG. 19) are electrically connected to each other, respectively, in order to apply electrical signals to the first semiconductor layer 31 and the second semiconductor layer 32. The element electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The element electrode layer 37 may also include an n-type or p-type doped semiconductor material.

The element insulating film 38 may be disposed to surround the side surface of the light emitting element ED. The element insulating film 38 may be disposed to expose end surfaces of the light emitting element ED. Specifically, the element insulating film 38 may be disposed to surround a side surface of the light emitting element core 30 and the side surface of the element electrode layer 37. The element insulating film 38 may be disposed to surround at least outer surfaces of the element active layer 33 and the second semiconductor layer 32. The element insulating film 38 may perform a function of protecting the semiconductor layers included in the light emitting element core 30. The element insulating film 38 may be made of materials having insulating properties to prevent an electrical short-circuit that may occur in case that the element active layer 33 is in direct contact with an electrode through which an electrical signal is transferred to the light emitting element ED. The element insulating film 38 may be disposed to completely cover the outer surface of the second semiconductor layer 32 to prevent a short-circuit that may occur in case that a contact electrode to be described later is in direct contact with the second semiconductor layer 32. The element insulating film 38 may protect outer surfaces of the first and second semiconductor layers 31 and 32 as well as the element active layer 33, and may thus prevent a decrease in luminous efficiency of the light emitting element ED.

The element insulating film 38 may include a first region 38A and a second region 38B. The first region 38A of the element insulating film 38 may be a partial region of the element insulating film 38 formed to surround the side surface of the light emitting element core 30, and the second region 38B of the element insulating film 38 may be another partial region of the element insulating film 38 formed to surround the side surface of the element electrode layer 37. The first region 38A of the element insulating film 38 and the second region 38B of the element insulating film 38 may be physically connected to each other. Accordingly, the first region 38A of the element insulating film 38 and the second region 38B of the element insulating film 38 may be integrated with each other without being physically distinguished from each other. The first region 38A of the element insulating film 38 and the second region 38B of the element insulating film 38 may include a same material, and may be formed through a same process.

The first region 38A of the element insulating film 38 may be disposed to surround the side surface of the light emitting element core 30, and may extend along a direction X, which may be an extension direction of the light emitting element core 30. Specifically, the first region 38A of the element insulating film 38 may be disposed to surround a side surface of the first semiconductor layer 31, the side surface of the second semiconductor layer 32, and a side surface of the element active layer 33. Accordingly, the element insulating film 38 may completely cover (or surround) at least the side surface of the second semiconductor layer 32 and the side surface of the element active layer 33. The element insulating film 38 may expose at least a lower surface of the first semiconductor layer 31. The lower surface of the first semiconductor layer 31 may be an end surface of the light emitting element ED.

In an embodiment, the first region 38A of the element insulating film 38 may be formed to have substantially the same thickness on the side surface of the light emitting element core 30. Accordingly, the thickness of the first region 38A of the element insulating film 38 may be substantially uniform in a direction X. Accordingly, the first region 38A of the element insulating film 38 may be formed to reflect a shape of the side surface of the light emitting element core 30. For example, in case that the side surface of the light emitting element core 30 has a step, an outer peripheral surface of the first region 38A of the element insulating film 38 may also have a shape in which the step of the side surface of the light emitting element core 30 is reflected. However, the disclosure is not limited thereto, and the first region 38A of the element insulating film 38 may also be formed to have different thicknesses along a direction X.

The second region 38B of the element insulating film 38 may be disposed to surround the side surface of the element electrode layer 37. The second region 38B of the element insulating film 38 may extend from the first region 38A of the element insulating film 38 in a direction X. The second region 38B of the element insulating film 38 may be disposed to surround a portion of the side surface of the element electrode layer 37, but may expose at least an upper surface of the element electrode layer 37. The upper surface of the element electrode layer 37 may be another end surface of the light emitting element ED.

The element insulating film 38 may include materials having insulating properties, such as silicon oxide ($SiO_x$), silicon nitride ($SiN_x$), silicon oxynitride ($SiO_xN_y$), aluminum nitride (AlN), and/or aluminum oxide ($AlO_x$). The element insulating film 38 may have a single film including the above-described materials or a multilayer structure in which films including the above-described materials are stacked on each other.

Figure 3:
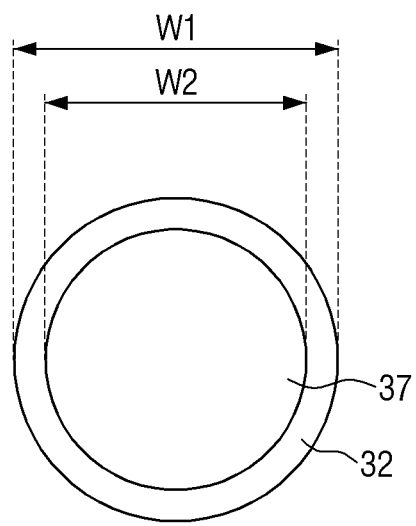
FIG. 3 is a schematic plan view illustrating an arrangement between an element electrode layer and a second semiconductor layer of the light emitting element according to an embodiment.
Figure 4:
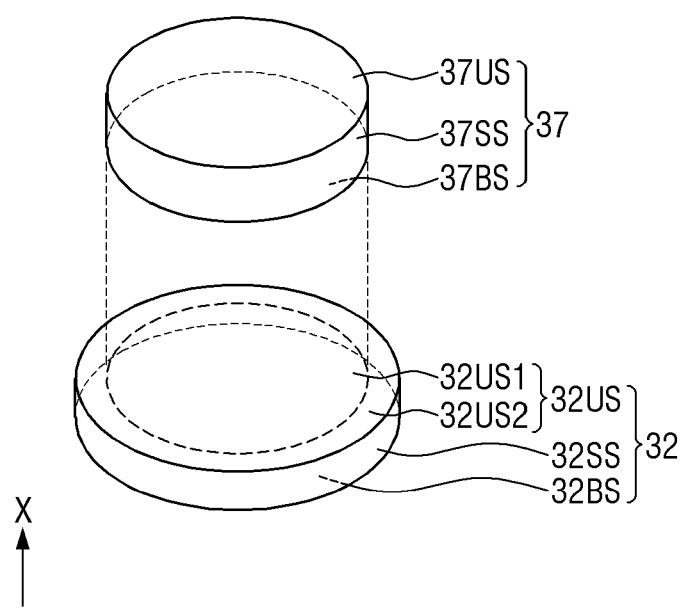
FIG. 4 is an exploded schematic perspective view of the element electrode layer and the second semiconductor layer of the light emitting element according to an embodiment.

FIG. 3 is a schematic plan view illustrating an arrangement between an element electrode layer and a second semiconductor layer of the light emitting element according to an embodiment. FIG. 4 is an exploded schematic perspective view of the element electrode layer and the second semiconductor layer of the light emitting element according to an embodiment.

Referring to FIGS. 3 and 4, the element electrode layer 37 may be disposed on the second semiconductor layer 32. The element electrode layer 37 may overlap the second semiconductor layer 32 in a direction X. As described above, the second semiconductor layer 32 may completely cover the element electrode layer 37 below the element electrode layer 37.

The element electrode layer 37 may include a first surface 37BS, a second surface 37US, and a third surface 37SS. The first surface 37BS of the element electrode layer 37 may be a surface facing the second semiconductor layer 32, the second surface 37US of the element electrode layer 37 may be a surface facing the first surface 37BS of the element electrode layer 37, and the third surface 37SS of the element electrode layer 37 may be a surface connecting the first surface 37BS of the element electrode layer 37 and the second surface 37US of the element electrode layer 37 to each other. The first surface 37BS of the element electrode layer 37 may be a lower surface 37BS of the element electrode layer 37, the second surface 37US of the element electrode layer 37 may be an upper surface 37US of the element electrode layer 37, and the third surface 37SS of the element electrode layer 37 may be a side surface 37SS of the element electrode layer 37.

The second semiconductor layer 32 may include a first surface 32US, a second surface 32BS, and a third surface 32SS. The first surface 32US of the second semiconductor layer 32 may be a surface facing the element electrode layer 37, the second surface 32BS of the second semiconductor layer 32 may be a surface facing the first surface 32US of the second semiconductor layer 32, and the third surface 32SS of the second semiconductor layer 32 may be a surface connecting the first surface 32US of the second semiconductor layer 32 and the second surface 32BS of the second semiconductor layer 32 to each other. The first surface 32US of the second semiconductor layer 32 may be an upper surface 32US of the second semiconductor layer 32, the second surface 32BS of the second semiconductor layer 32 may be a lower surface of the second semiconductor layer 32, and the third surface 32SS of the second semiconductor layer 32 may be a side surface 32SS of the second semiconductor layer 32.

In an embodiment, a diameter W1 of the second semiconductor layer 32 may be greater than a diameter W2 of the element electrode layer 37. The diameter W1 of the second semiconductor layer 32 may be greater than the diameter W2 of the element electrode layer 37, and the second semiconductor layer 32 may completely cover the element electrode layer 37 below the element electrode layer 37, and accordingly, the element electrode layer 37 may be disposed inside the second semiconductor layer 32 in plan view. Accordingly, the second semiconductor layer 32 may include a region in which it overlaps the element electrode layer 37 in a direction X and a region in which it may not overlap element electrode layer 37 in a direction X. For example, a portion of the second semiconductor layer 32 may be exposed in a direction X on a plane of the element electrode layer 37.

An area of the second semiconductor layer 32 in plan view may be greater than an area of the element electrode layer 37 in plan view. In order to prevent the side surface 32SS of the second semiconductor layer 32 from being exposed due to over-etching of the element insulating film 38 in a process of removing a portion the element insulating film 38 to expose the upper surface 37US of the element electrode layer 37 among processes of manufacturing the light emitting element ED, the area of the element electrode layer 37 in plan view and the area of the second semiconductor layer 32 in plan view may have an area ratio therebetween. In an embodiment, the area of the element electrode layer 37 in plan view may be in the range of 75% to 95% of the area of the second semiconductor layer 32 in plan view. The area of the element electrode layer 37 in plan view and the area of the second semiconductor layer 32 in plan view may be measured as areas of surfaces of the element electrode layer 37 and the second semiconductor layer 32 facing each other. For example, the area of the element electrode layer 37 in plan view may be measured as an area of the lower surface 37BS of the element electrode layer 37, the area of the second semiconductor layer 32 in plan view may be measured as an area of the upper surface 32US of the second semiconductor layer 32, and the lower surface 37BS of the element electrode layer 37 and the upper surface 32US of the second semiconductor layer 32 may come into contact with each other.

Figure 5A:
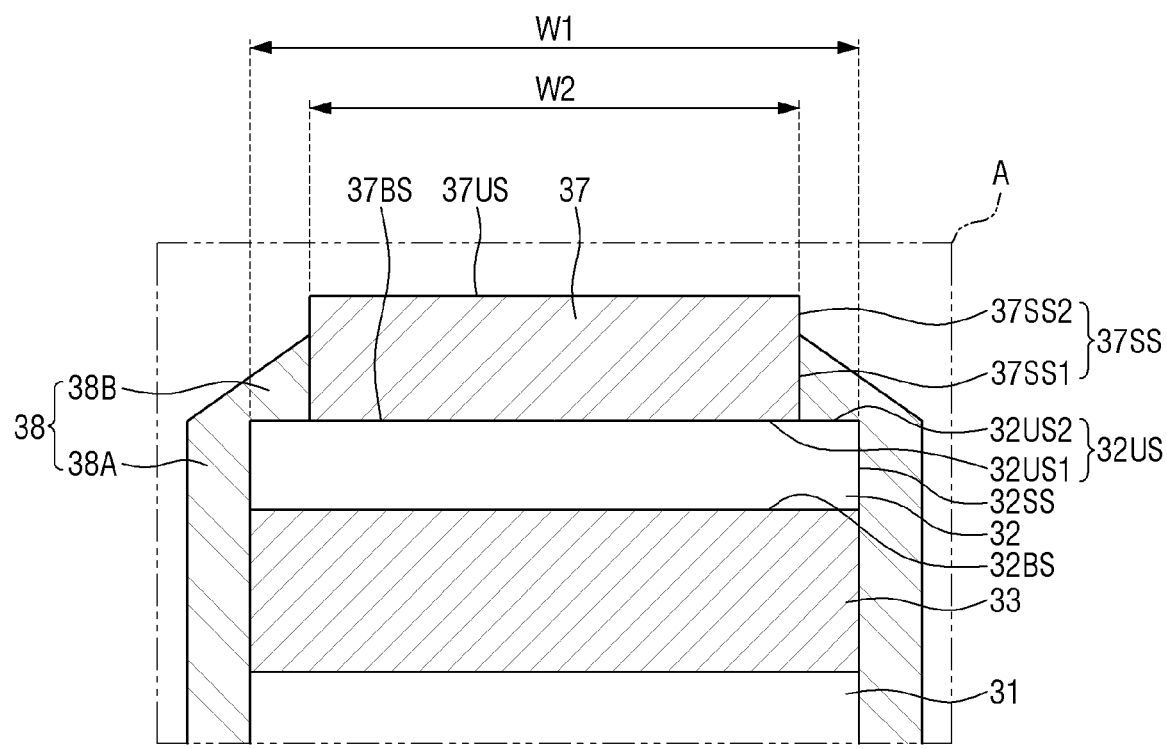
FIG. 5A is an enlarged schematic cross-sectional view illustrating an example of region A of FIG. 2.
Figure 6:
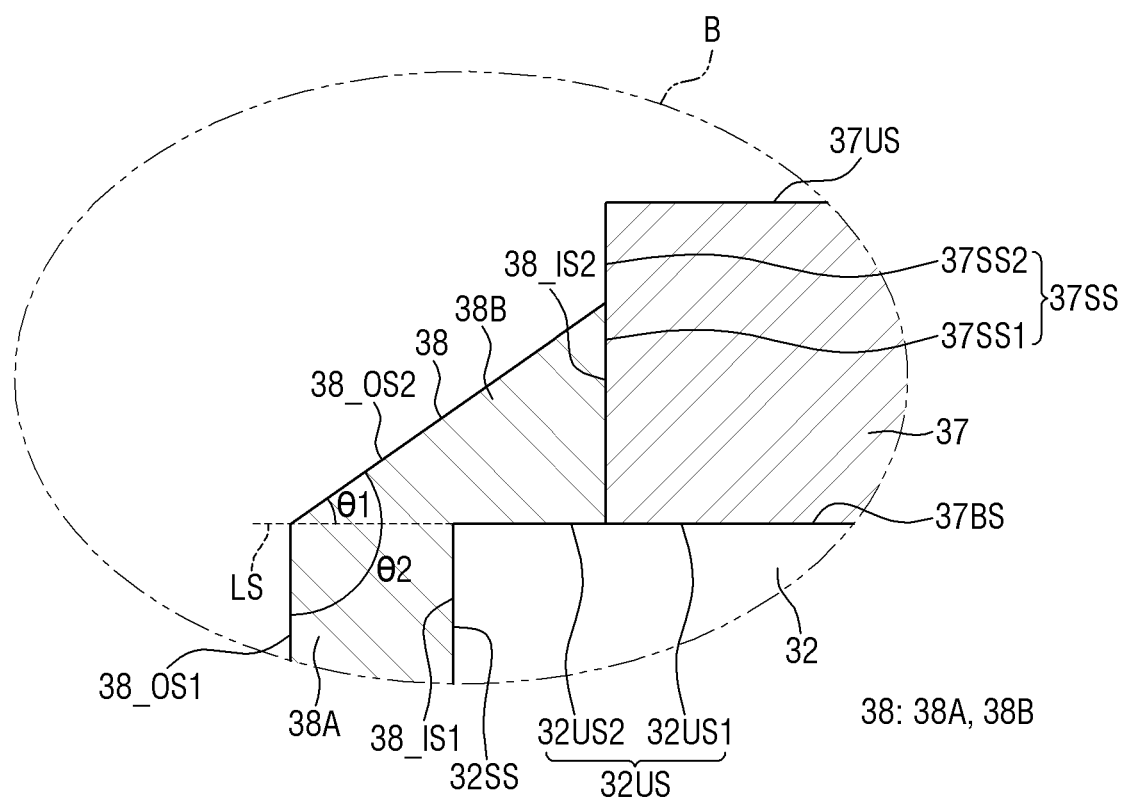
FIG. 6 is an enlarged schematic cross-sectional view of region B of FIG. 2.

FIG. 5A is an enlarged schematic cross-sectional view illustrating an example of region A of FIG. 2. FIG. 6 is an enlarged schematic cross-sectional view of region B of FIG. 2.

As described later, processes of manufacturing the light emitting element ED may include a process of forming the light emitting element core 30 extending in a direction X and the element electrode layer 37 disposed on the light emitting element core 30, forming an element insulating material layer covering (e.g., completely covering) outer surfaces of the light emitting element core 30 and the element electrode layer 37, and etching the element insulating material layer in order to remove the element insulating material layer disposed on the upper surface 37US of the element electrode layer 37 in order to expose the upper surface 37US of the element electrode layer 37. The etching process of the element insulating material layer may need to have a sufficient process time in order to completely remove the element insulating material layer disposed on the upper surface 37US of the element electrode layer 37. In case that the etching process is performed in the sufficient process time, a portion of the element insulating film 38 positioned at an upper portion may be over-etched, and in the over-etched region, the side surfaces of the light emitting element core 30 and/or the element electrode layer 37 surrounded by the element insulating material layer may be exposed. Accordingly, in order not to expose the outer surface of the second semiconductor layer 32 disposed adjacent to a lower portion of the element electrode layer 37, as described above, the element electrode layer 37 may expose a portion of the second semiconductor layer 32, and the area of the element electrode layer 37 in plan view and the area of the second semiconductor layer 32 in plan view may have an area ratio therebetween. Accordingly, in the processes of manufacturing the light emitting element ED, the element insulating film 38 may have a specific shape in a region adjacent to the element electrode layer 37.

Figure 5B:
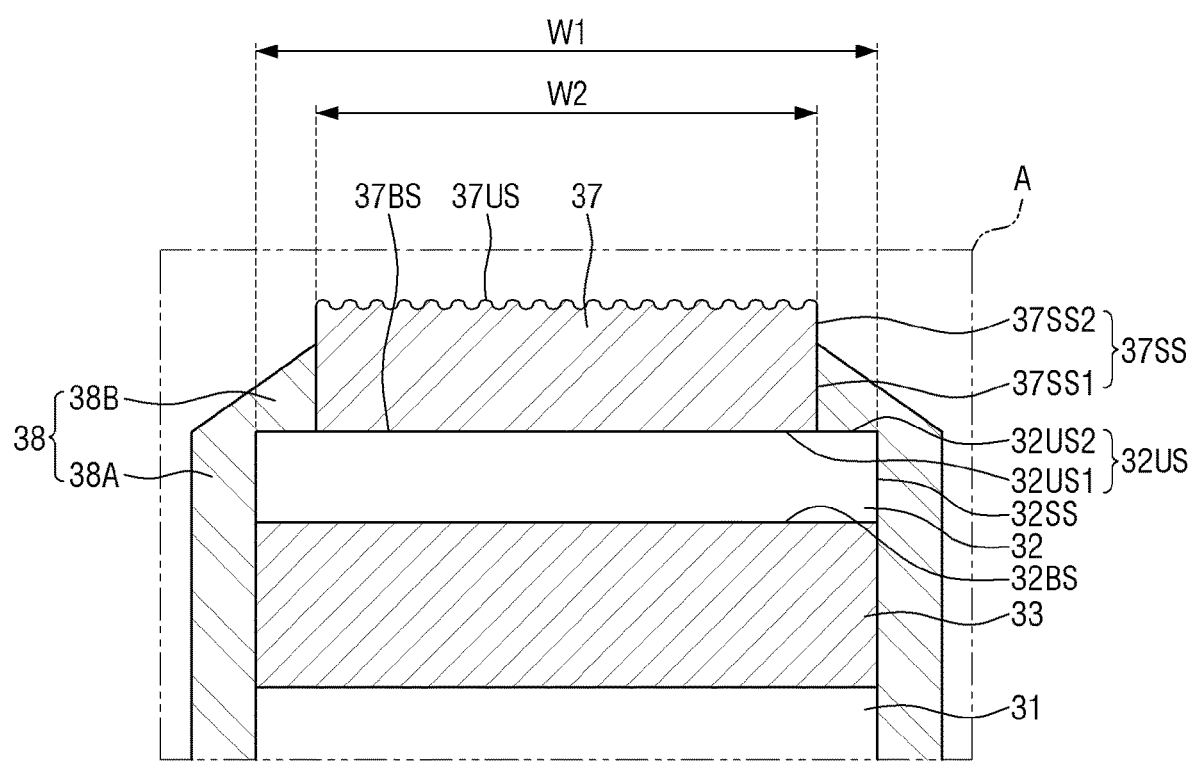
FIG. 5B is an enlarged schematic cross-sectional view illustrating another example of region A of FIG. 2.

Although it has been illustrated in FIG. 5A that the second surface 37US of the element electrode layer 37 may be formed to be flat, but an embodiment of the disclosure is not limited thereto. For example, as illustrated in FIG. 5B, the second surface 37US of the element electrode layer 37 may have a concave-convex surface, that is, a rugged surface. For example, flatness of the second surface 37US of the element electrode layer 37 may vary depending on a deposition method.

Referring to FIGS. 3 to 5A, the element electrode layer 37 may be formed to have the diameter W2 smaller than the diameter W1 of the second semiconductor layer 32, and accordingly, the side surface 37SS of the element electrode layer 37 may be aligned inside the side surface 32SS of the second semiconductor layer 32.

The upper surface 32US of the second semiconductor layer 32 may include a first region 32US1 and a second region 32US2. The first region 32US1 of the upper surface 32US of the second semiconductor layer 32 may be a region that overlaps the element electrode layer 37 in a direction X, and the second region 32US2 of the upper surface 32US of the second semiconductor layer 32 may be a region that may not overlap the element electrode layer 37 in a direction X. In other embodiments, the first region 32US1 of the upper surface 32US of the second semiconductor layer 32 may be a region that is in contact with the lower surface 37BS of the element electrode layer 37, and the second region 32US2 of the upper surface 32US of the second semiconductor layer 32 may be a region that may not be in contact with the lower surface 37BS of the element electrode layer 37. The second region 32US2 of the upper surface 32US of the second semiconductor layer 32 may be a partial region of the upper surface 32US of the second semiconductor layer 32 exposed by the element electrode layer 37.

The element electrode layer 37 may overlap the second semiconductor layer 32 in a direction X substantially at a central portion of the second semiconductor layer 32. Accordingly, the second region 32US2 of the upper surface 32US of the second semiconductor layer 32 may be disposed to surround the first region 32US1 of the upper surface 32US of the second semiconductor layer 32. An area of the first region 32US1 of the upper surface 32US of the second semiconductor layer 32 may be greater than an area of the second region 32US2 of the upper surface 32US of the second semiconductor layer 32.

As described above, the element insulating film 38 may be in direct contact with the side surface of the light emitting element core 30 and the side surface of the element electrode layer 37, and may be disposed to surround the side surface of the light emitting element core 30 and the side surface of the element electrode layer 37.

The second region 38B of the element insulating film 38 may be disposed to surround the side surface 37SS of the element electrode layer 37. The second region 38B of the element insulating film 38 may be in contact with the upper surface 32US of the second semiconductor layer 32 exposed by the element electrode layer 37. Specifically, the second region 38B of the element insulating film 38 may be in contact with the second region 32US2 of the upper surface 32US of the second semiconductor layer 32. The second region 38B of the element insulating film 38 may be disposed to completely cover the second region 32US2 of the upper surface 32US of the second semiconductor layer 32. Accordingly, the element insulating film 38 may completely cover the side surface 32SS and the second region 32US2 of the upper surface 32US of the second semiconductor layer 32.

Referring to FIGS. 5A and 6, the first region 38A of the element insulating film 38 may have a substantially uniform thickness along a direction X. Specifically, an interval between an inner peripheral surface 38_IS1 and an outer peripheral surface 38_OS1 of the first region 38A of the element insulating film 38 may be uniformly formed along a direction X. The inner peripheral surface 38_IS1 of the first region 38A of the element insulating film 38 may be an inner side surface 38_IS1 of the first region 38A of the element insulating film 38 in contact with the side surface of the light emitting element core 30, for example, the side surface 32SS of the second semiconductor layer 32, and the outer peripheral surface 38_OS1 of the first region 38A of the element insulating film 38 may be an outer side surface 38_OS1 of the first region 38A of the element insulating film 38 facing the inner peripheral surface 38_IS1 of the first region 38A of the element insulating film 38.

A thickness of the second region 38B of the element insulating film 38 may decrease along a direction X. Specifically, the thickness of the second region 38B of the element insulating film 38 may decrease as the second region 38B becomes more distant from the second semiconductor layer 32 (toward an upper portion thereof). The thickness of the second region 38B of the element insulating film 38 may be measured as an interval between an inner peripheral surface 38_IS2 and an outer peripheral surface 38_OS2 of the second region 38B of the element insulating film 38. The inner peripheral surface 38_IS2 of the second region 38B of the element insulating film 38 may be an inner side surface 38_IS2 of the second region 38B of the element insulating film 38 in contact with the side surface 37SS of the element electrode layer 37, and the outer peripheral surface 38_OS2 of the second region 38B of the element insulating film 38 may be an outer side surface 38_OS2 of the second region 38B of the element insulating film 38.

The second region 38B of the element insulating film 38 may be formed so that the outer side surface 38_OS2 thereof is inclined at an angle. For example, the second region 38B of the element insulating film 38 may have the outer side surface (or the outer peripheral surface) 38_OS2 inclined with respect to a direction X, which may be the extension direction of the light emitting element ED. As the thickness of the second region 38B of the element insulating film 38 decreases along a direction X, the second region 38B of the element insulating film 38 may have the inclined outer side surface (or outer peripheral surface) 38_OS2. An inclination angle θ1 of the outer side surface 38_OS2 of the second region 38B of the element insulating film 38 may be measured as a size between a plane LS on which the upper surface 32US of the second semiconductor layer 32 is positioned and the outer side surface 38_OS2 of the second region 38B of the element insulating film 38. In an embodiment, the inclination angle θ1 of the outer side surface 38_OS2 of the second region 38B of the element insulating film 38 may have a range of 60° or less, and in an embodiment, a range less than 50°. An inclination angle θ2 of the outer side surface 38_OS2 of the second region 38B of the element insulating film 38 may also be measured as a size between the outer side surface 38_OS1 of the first region 38A of the element insulating film 38 and the outer side surface 38_OS2 of the second region 38B of the element insulating film 38.

The second region 38B of the element insulating film 38 may expose a portion of the side surface 37SS of the element electrode layer 37. Accordingly, the side surface 37SS of the element electrode layer 37 may include a first region 37SS1 covered by the second region 38B of the element insulating film 38 and a second region 37SS2 exposed by the second region 38B of the element insulating film 38. The second region 37SS2 of the side surface 37SS of the element electrode layer 37 may be positioned above the first region 37SS1 of the side surface 37SS of the element electrode layer 37. However, the disclosure is not limited thereto, and the second region 38B of the element insulating film 38 may also completely cover the side surface 37SS of the element electrode layer 37.

Figure 7:
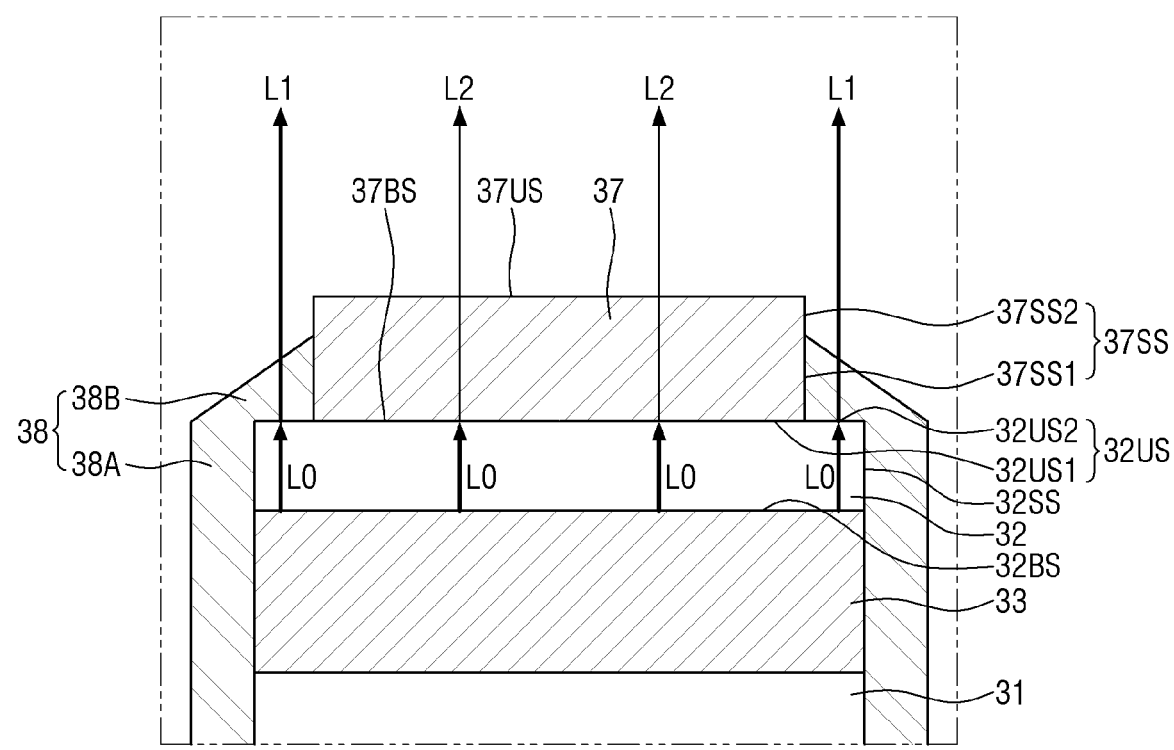
FIG. 7 is a schematic view illustrating paths of light emitted from the light emitting element according to an embodiment.

FIG. 7 is a schematic view illustrating paths of light emitted from the light emitting element according to an embodiment.

Referring to FIG. 7, some light L2 among light L0 generated in the element active layer 33 of the light emitting element ED and traveling toward the second semiconductor layer 32 may be incident to the element electrode layer 37 through the first region 32US1 of the upper surface 32US of the second semiconductor layer 32, and may be transmitted through the element electrode layer 37 and be emitted to the outside of the light emitting element ED. Some light L2 among the light incident on the element electrode layer 37 through the first region 32US1 of the upper surface 32US of the second semiconductor layer 32 may be transmitted through the element electrode layer 37 and be emitted to the outside of the light emitting element ED, but some other light may not be transmitted through the element electrode layer 37 and may not be emitted to the outside of the light emitting element ED. On the other hand, some other light L1 among the light L0 generated in the element active layer 33 of the light emitting element ED and traveling toward the second semiconductor layer 32 may be emitted to the outside of the light emitting element ED through the second region 32US2 of the upper surface 32US of the second semiconductor layer 32. Accordingly, an amount of the light L2 emitted to the outside of the light emitting element ED through the element electrode layer 37 may be smaller than an amount of the light L1 emitted through the second semiconductor layer 32 without passing through the element electrode layer 37.

With the light emitting element ED according to an embodiment, the element electrode layer 37 may be formed to be smaller than the second semiconductor layer 32 in plan view, and may be formed so that the area of the element electrode layer 37 is in the range of 75% to 95% of the area of the second semiconductor layer 32, such that an amount of light emitted from the element active layer 33 to the outside of the light emitting element ED through the element electrode layer 37 may be decreased, and thus, an amount of light emitted from the light emitting element ED may be increased. Accordingly, a display quality of the display device including the light emitting element ED may be improved.

Hereinafter, processes of manufacturing the light emitting element according to an embodiment will be described with reference to FIGS. 8 to 16. Hereinafter, a description of a method, a process condition, or the like of forming the semiconductor layers will be omitted, and a sequence of a method of manufacturing the light emitting element ED or a stack structure of the light emitting element ED will be described in detail.

Figure 16:
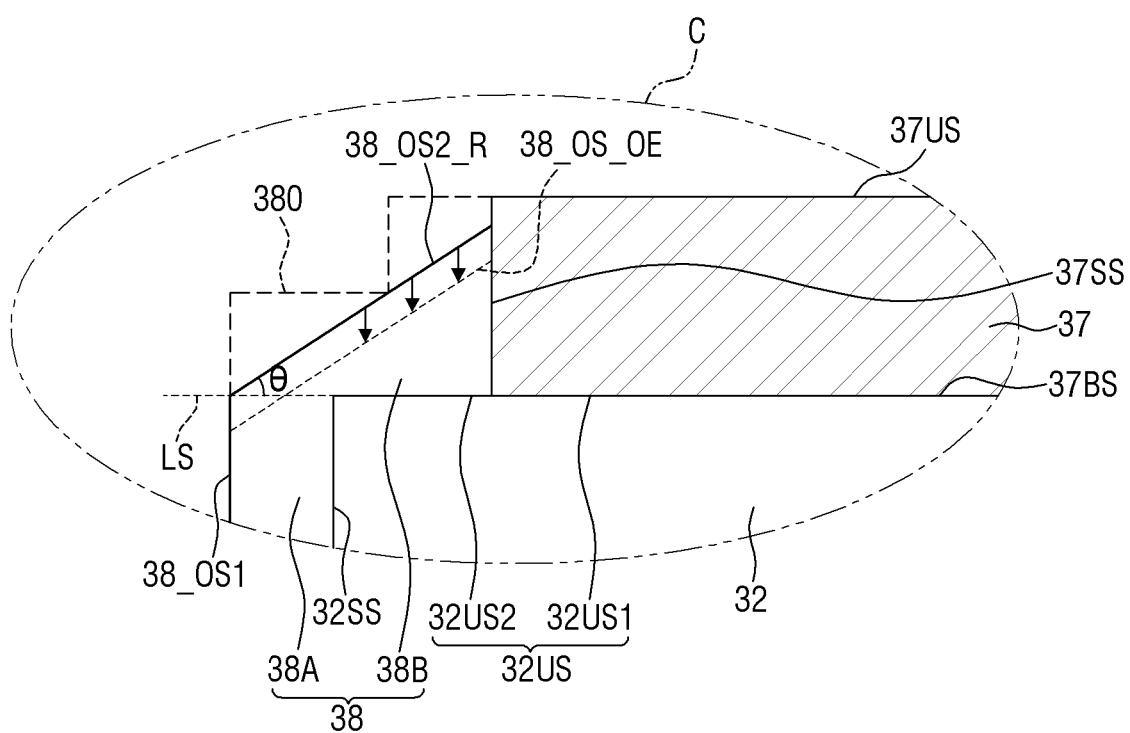
FIG. 16 is a schematic enlarged view illustrating an example of region C of FIG. 15 in order to describe a case in which an element insulating film of the light emitting element is over-etched.
Figure 17:
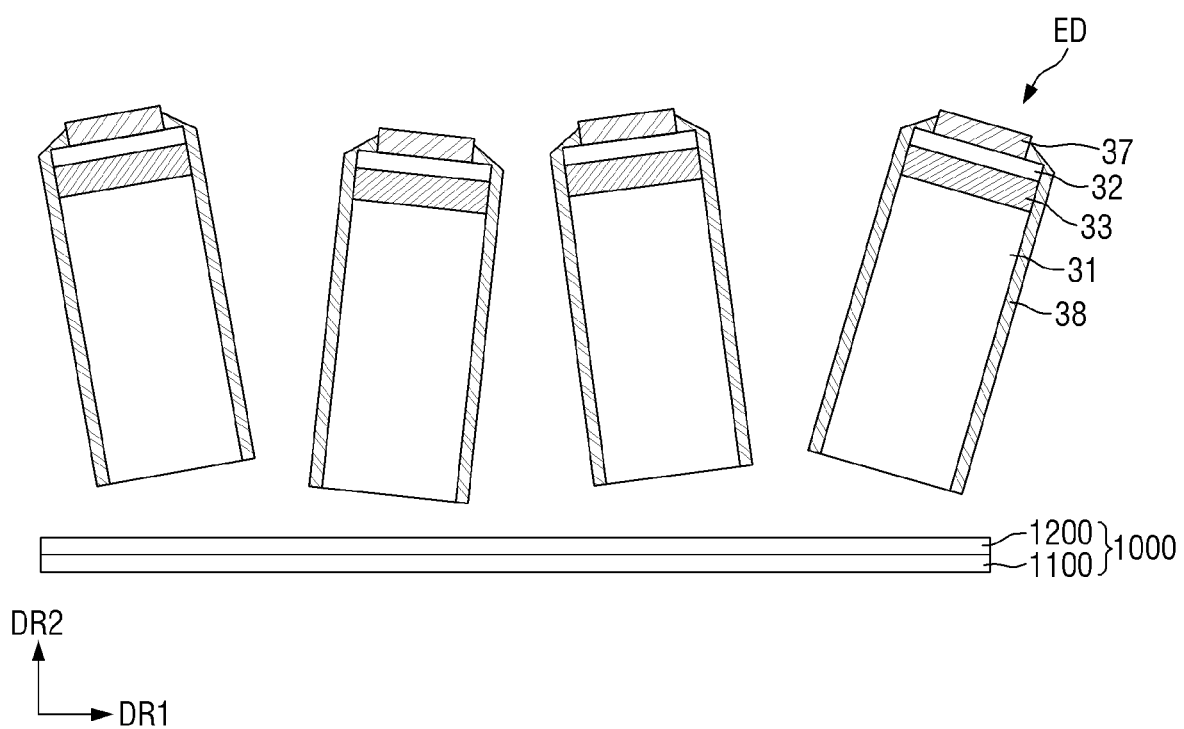
FIG. 17 is a schematic cross-sectional view illustrating certain processes of manufacturing the light emitting element according to an embodiment.

FIGS. 8 to 15 are schematic cross-sectional views illustrating some of processes of manufacturing the light emitting element according to an embodiment. FIG. 16 is a schematic enlarged view illustrating an example of region C of FIG. 15 in order to describe a case in which an element insulating film of the light emitting element is over-etched. FIG. 17 is a schematic cross-sectional view illustrating certain processes of manufacturing the light emitting element according to an embodiment.

Hereinafter, a first direction DR1 and a second direction DR2 may be defined in the drawings of an embodiment for describing processes of manufacturing the light emitting element ED. The first direction DR1 and the second direction DR2 may be directions perpendicular to each other. The second direction DR2 may be a direction parallel to a direction X, which may be an extension direction of the light emitting element ED formed on a lower substrate 1000. In an embodiment for describing the processes of manufacturing the light emitting element ED, unless otherwise stated, the term "upper portion" may refer to a side in the second direction DR2 and may refer to a direction in which semiconductor layers of the light emitting element ED are stacked on each other on a surface (or an upper surface) of the lower substrate 1000, and the term "upper surface" may refer to a surface toward a side of the second direction DR2. The "lower portion" may refer to another side in the second direction DR2, and the term "lower surface" may refer to a surface toward the another side in the second direction DR2.

Figure 8:
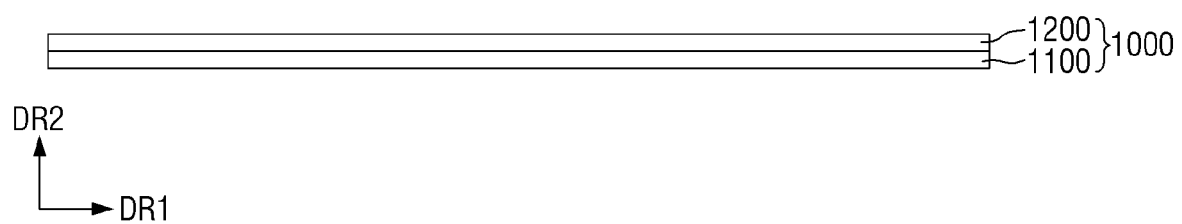
FIGS. 8 to 15 are schematic cross-sectional views illustrating processes of manufacturing the light emitting element according to an embodiment.

First, referring to FIG. 8, the lower substrate 1000 may be prepared.

Specifically, the lower substrate 1000 may include a base substrate 1100 and a buffer material layer 1200 disposed on the base substrate 1100.

The base substrate 1100 may include a sapphire ($Al_xO_y$) substrate and a transparent substrate such as a glass substrate. However, the disclosure is not limited thereto, and the base substrate 1100 may also include a conductive substrate made of GaN, SiC, ZnO, Si, GaP, GaAs, and the like, or a combination thereof. In an embodiment, the base substrate 1100 may be a sapphire substrate ($Al_xO_y$).

Semiconductor layers may be formed on the base substrate 1100. The semiconductor layers may be formed by growing seed crystals on the base substrate 1100 by epitaxial growth. A method of forming the semiconductor layers may be electron beam deposition, physical vapor deposition (PVD), chemical vapor deposition (CVD), plasma laser deposition (PLD), dual-type thermal evaporation, sputtering, metal organic chemical vapor deposition (MOCVD), or the like, or a combination thereof.

The buffer material layer 1200 may be formed on a surface (or an upper surface) of the base substrate 1100. The buffer material layer 1200 may serve to decrease a lattice constant difference between the base substrate 1100 and a first semiconductor material layer 3100 (see FIG. 9) to be described later. The buffer material layer 1200 may include an undoped semiconductor. The buffer material layer 1200 may include the same material as a first semiconductor material layer 3100 to be described later, but may include a material that may not be doped with a first conductivity-type dopant or a second conductivity-type dopant, for example, an n-type dopant or a p-type dopant. It has been illustrated in FIG. 8 that one buffer material layer 1200 is stacked, but the disclosure is not limited thereto, and multiple buffer material layers 1200 may also be formed. The buffer material layer 1200 may also be omitted depending on a type of the base substrate 1100.

Figure 9:
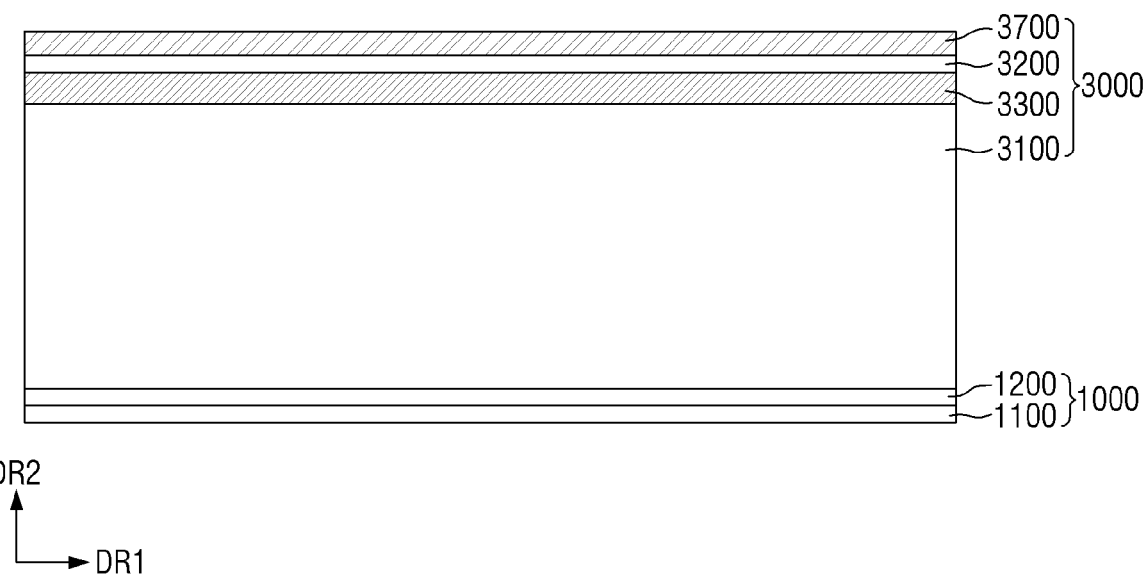

Referring to FIG. 9, a first stack structure 3000 may be formed on the lower substrate 1000.

Specifically, the first stack structure 3000 in which a first semiconductor material layer 3100, an active material layer 3300, a second semiconductor material layer 3200, and an electrode material layer 3700 may be sequentially stacked on each other may be formed on the lower substrate 1000.

Layers included in the first stack structure 3000 may correspond to the respective layers included in the light emitting element core 30 and the element electrode layer 37 according to an embodiment. Specifically, the first semiconductor material layer 3100, the active material layer 3300, and the second semiconductor material layer 3200 of the first stack structure 3000 may correspond to the first semiconductor layer 31, the element active layer 33, and the second semiconductor layer 32 of the light emitting element core 30, respectively, the electrode material layer 3700 of the first stack structure 3000 may correspond to the element electrode layer 37, and the first semiconductor material layer 3100, the active material layer 3300, the second semiconductor material layer 3200, and the electrode material layer 3700 of the first stack structure 3000 may include the same materials as the materials included in the respective layers.

Figure 10:
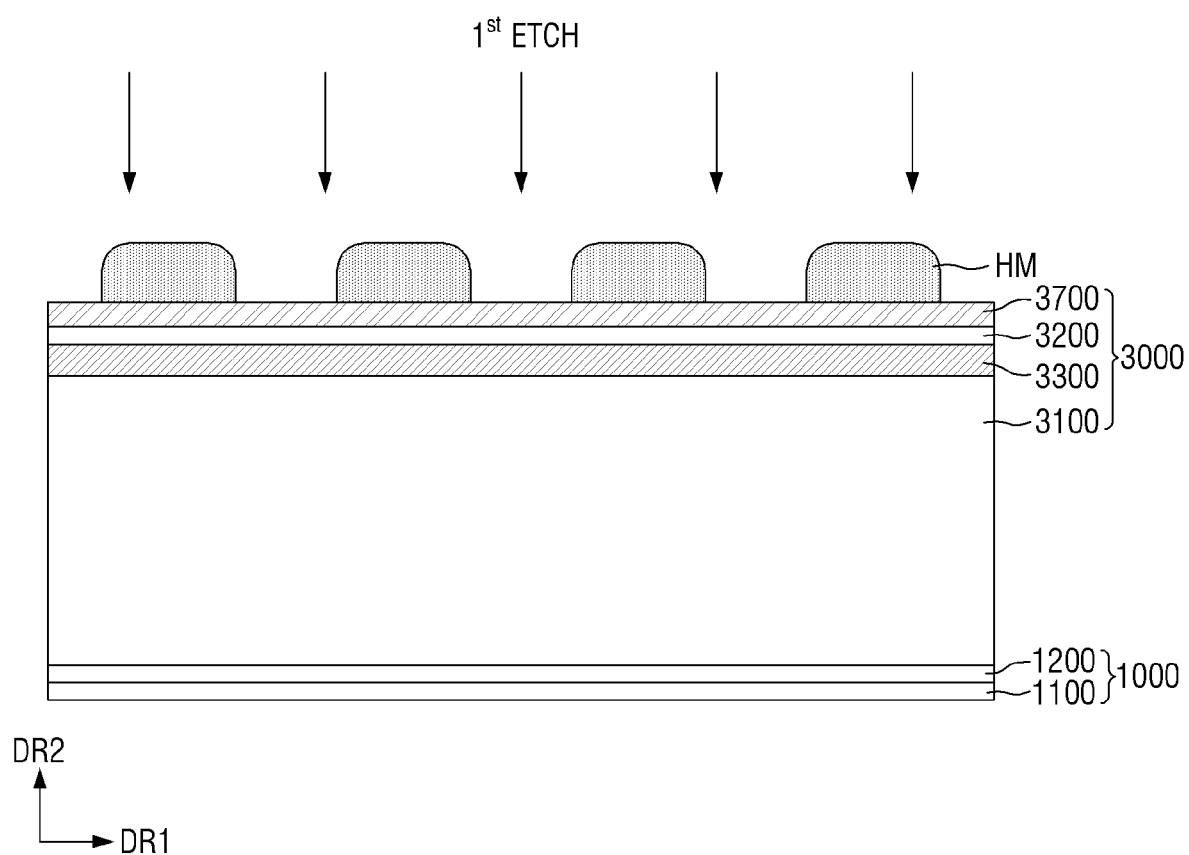

Referring to FIG. 10, a mask pattern HM may be formed on the first stack structure 3000.

Specifically, the mask pattern HM may include patterns spaced apart from each other. The mask patterns HM may be disposed to be spaced apart from each other on the first stack structure 3000. In some embodiments, the mask patterns HM may have the same diameter or width.

Figure 11:
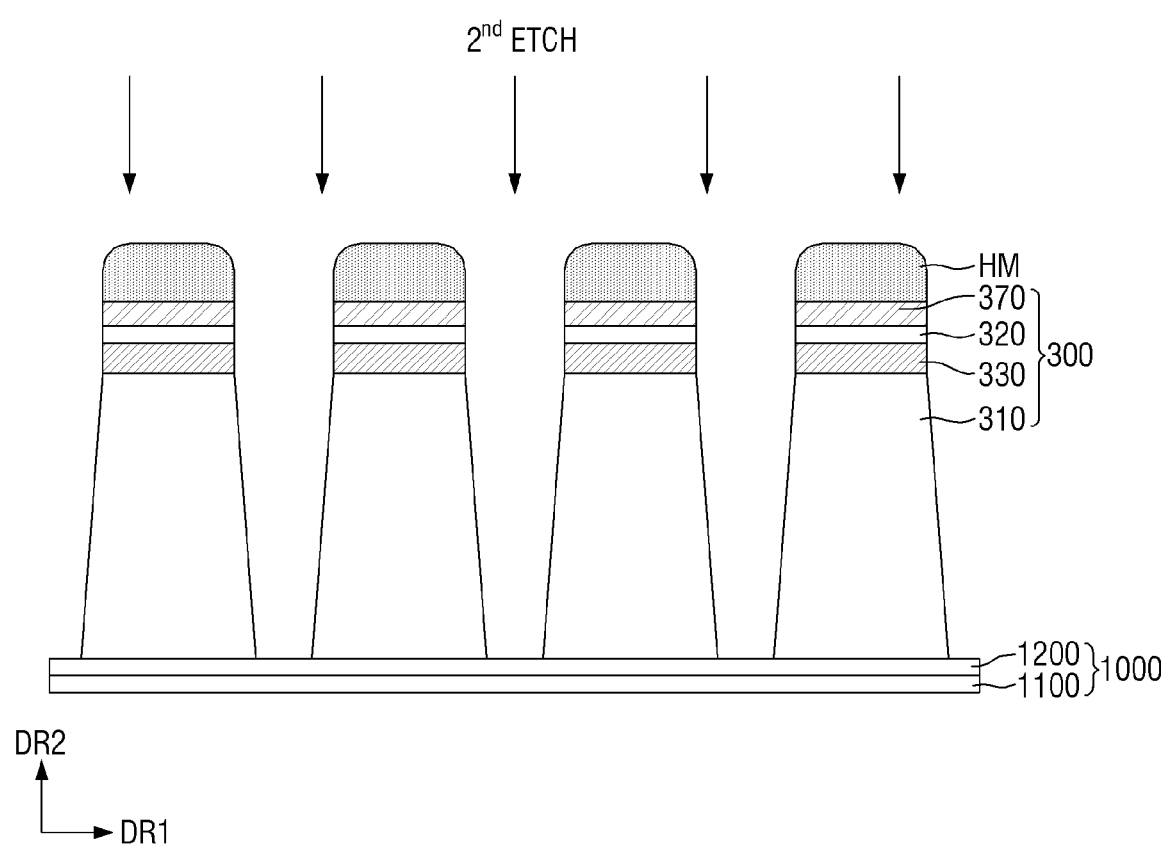

Referring to FIGS. 10 and 11, a first etching process $1^{st}$ ETCH of etching the first stack structure 3000 using the mask pattern HM as an etching mask may be performed.

Specifically, the first etching process $1^{st}$ ETCH of etching the first stack structure 3000 in a direction perpendicular to an upper surface of the lower substrate 1000 (e.g., the second direction) along the mask pattern HM using the mask pattern HM of FIG. 10 as an etching mask may be performed to form second stack structures 300 spaced apart from each other as illustrated in FIG. 11.

The first stack structure 3000 may be etched along spaced spaces of the mask pattern HM including the patterns spaced apart from each other. Partial regions of the first stack structure 3000 overlapping the mask pattern HM may be covered and remain by the mask pattern HM in the first etching process, and other partial regions of the first stack structure 3000 that does not overlap the mask pattern HM may be exposed and removed by the mask pattern HM in the first etching process. Accordingly, as illustrated in FIG. 11, the second stack structures 300 spaced apart from each other may be formed.

The first etching process $1^{st}$ ETCH of etching the first stack structure 3000 may be a dry etching method, a wet etching method, a reactive ion etching (ME) method, an inductively coupled plasma reactive ion etching (ICP-RIE) method, or the like, or a combination thereof. In a case of the dry etching method, anisotropic etching is possible, and the dry etching method may thus be suitable for vertical etching. In an embodiment, the first etching process $1^{st}$ ETCH of etching the first stack structure 3000 may be performed by the dry etching method.

A first semiconductor material layer 310 of the second stack structure 300 may have a shape in which a width thereof decreases toward an upper portion thereof. For example, the first semiconductor material layer 310 of the second stack structure 300 may have a trapezoidal shape in a cross section cut in the second direction DR2. The first semiconductor material layer 310 of the second stack structure 300 may have a shape in which a side surface thereof is inclined.

It has been illustrated in FIG. 11 that the first semiconductor material layer 310 of the second stack structure 300 has the shape in which the side surface thereof is inclined and an active material layer 330, a second semiconductor material layer 320, and an electrode material layer 370 of the second stack structure 300 have a vertical shape, but the disclosure is not limited thereto. For example, the first semiconductor material layer 310, the active material layer 330, the second semiconductor material layer 320, and the electrode material layer 370 included in the second stack structure 300 may also have a shape in which respective side surfaces thereof are aligned with each other, but are inclined.

Figure 12:
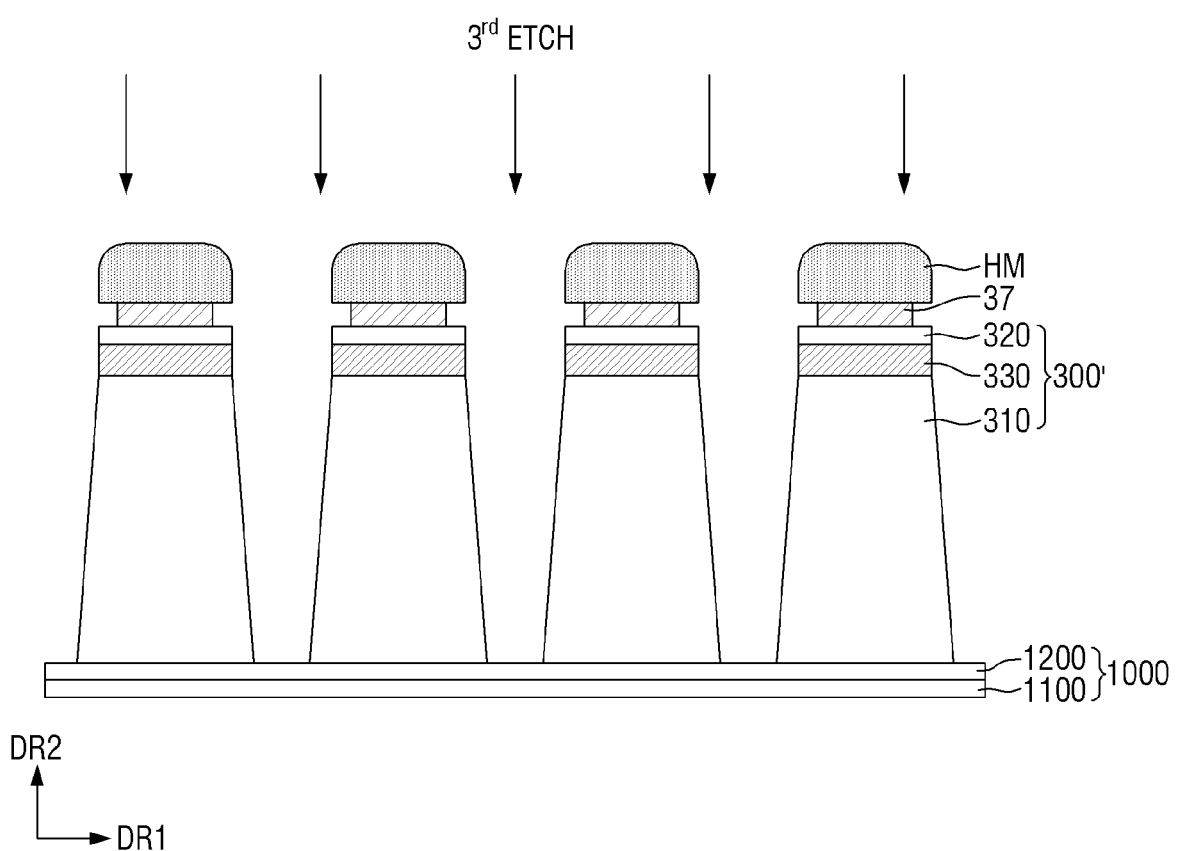

Referring to FIGS. 11 and 12, a second etching process $2^{nd}$ ETCH of etching portions of the electrode material layers 370 of the second stack structures 300 may be performed to expose upper surfaces of the second semiconductor material layers 320.

Specifically, the mask pattern HM may be maintained, the second etching process $2^{nd}$ ETCH of exposing portions of the electrode material layers 370 of the second stack structures 300 of FIG. 11 may be performed. The second etching process of etching the electrode material layer 370 may be performed by wet etching. Only the electrode material layers 370 of the second stack structures 300 may be selectively etched through the second etching process performed by the wet etching. Accordingly, as illustrated in FIG. 12, the electrode material layers 370 are etched, such that the element electrode layers 37 may be formed, and the first semiconductor material layers 310, the second semiconductor material layers 320 and the active material layers 330 of the second stack structures 300 may remain to constitute third stack structures 300'.

The electrode material layers 370 may be etched inward from side surfaces of the electrode material layers 370 that may not be covered with the mask pattern HM using an etchant in the second etching process, such that as illustrated in FIG. 12, the element electrode layers 37 may expose upper surfaces of the second semiconductor material layers 320 of the third stack structures 300'.

Figure 13:
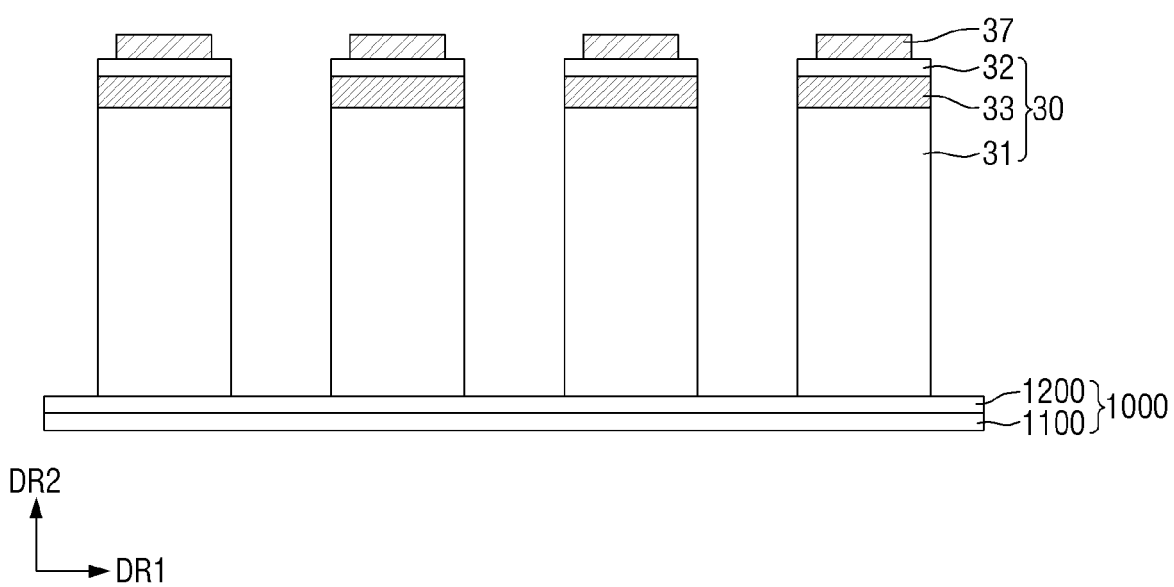

Referring to FIGS. 12 and 13, a third etching process $3^{rd}$ ETCH may be performed on the third stack structures 300' to form the light emitting element cores 30.

Specifically, the third etching process $3^{rd}$ ETCH of etching the first semiconductor material layers 310, the second semiconductor material layers 320, and the active material layers 330 of the third stack structures 300' of FIG. 12 may be performed to form the light emitting element cores 30 in which side surfaces may be aligned with each other as illustrated in FIG. 13.

The third etching process of etching the third stack structures 300' may be performed by wet etching. Portions of the side surfaces of the first semiconductor material layers 310, the active material layers 330, and the second semiconductor material layers 320 of the third stack structures 300' may etch through the third etching process performed by the wet etching process, such that the above-described light emitting element cores 30 as illustrated in FIG. 13 may be formed.

Figure 14:
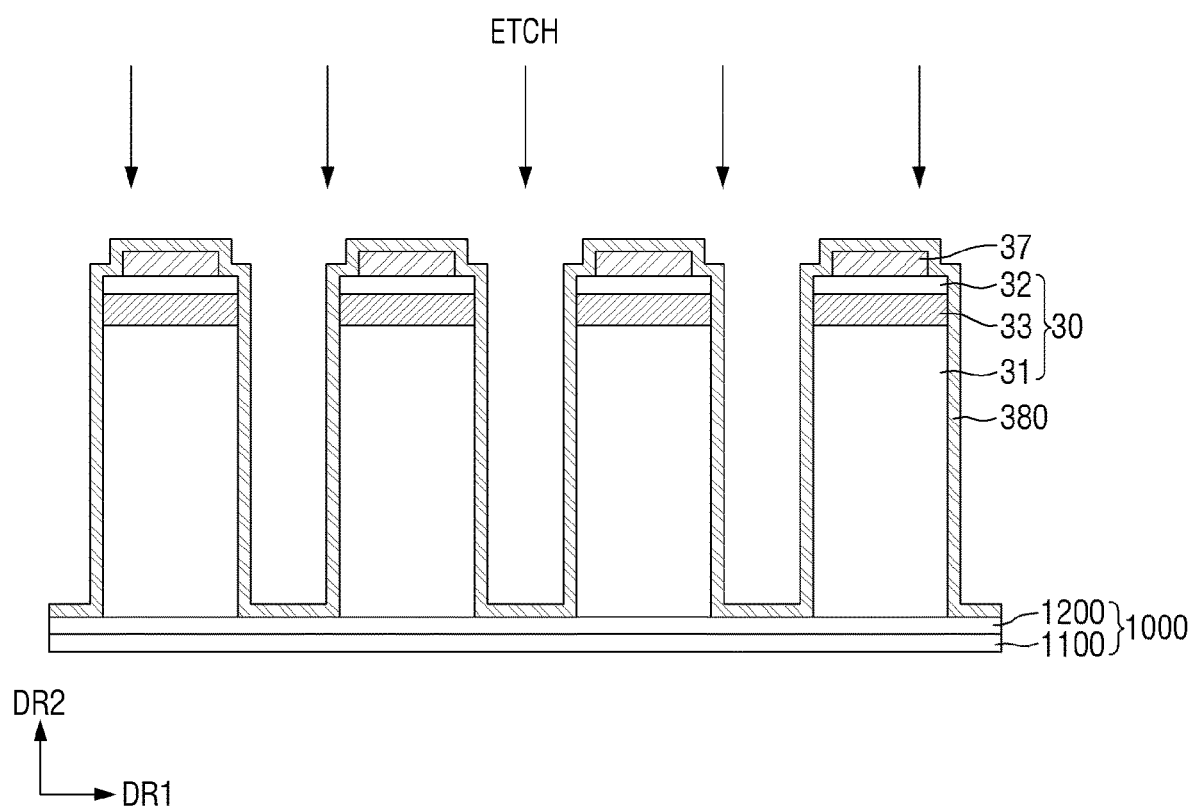

Referring to FIG. 14, the mask pattern HM may be removed, and an insulating material layer 380 covering outer surfaces of the light emitting element cores 30 and the element electrode layers 37 may be formed.

Specifically, the insulating material layer 380 may be formed on the outer surfaces of the light emitting element cores 30 and the element electrode layers 37. The insulating material layer 380 may be formed on an entire surface of the lower substrate 1000 to be formed not only on the outer surfaces of the light emitting element cores 30 and the element electrode layers 37, but also on the upper surface of the buffer material layer 1200 exposed by the light emitting element cores 30.

The outer surfaces of the light emitting element core 30 may include a side surface of the first semiconductor layer 31, a side surface of the element active layer 33, a side surface of the second semiconductor layer 32, and an upper surface of the second semiconductor layer 32 exposed by the element electrode layer 37. The outer surfaces of the element electrode layer 37 may include a side surface and an upper surface of the element electrode layer 37. The insulating material layer 380 may correspond to the element insulating film 38 of the light emitting element ED, and may include the same material as that of the element insulating film 38.

The insulating material layer 380 may be formed by a method of applying an insulating material to the outer surfaces of the light emitting element core 30 and the element electrode layer 37, a method of immersing the outer surfaces of the light emitting element core 30 and the element electrode layer 37 in an insulating material, or the like. For example, the insulating material layer 380 may be formed by atomic layer deposition (ALD) or chemical vapor deposition (CVD).

Figure 15:
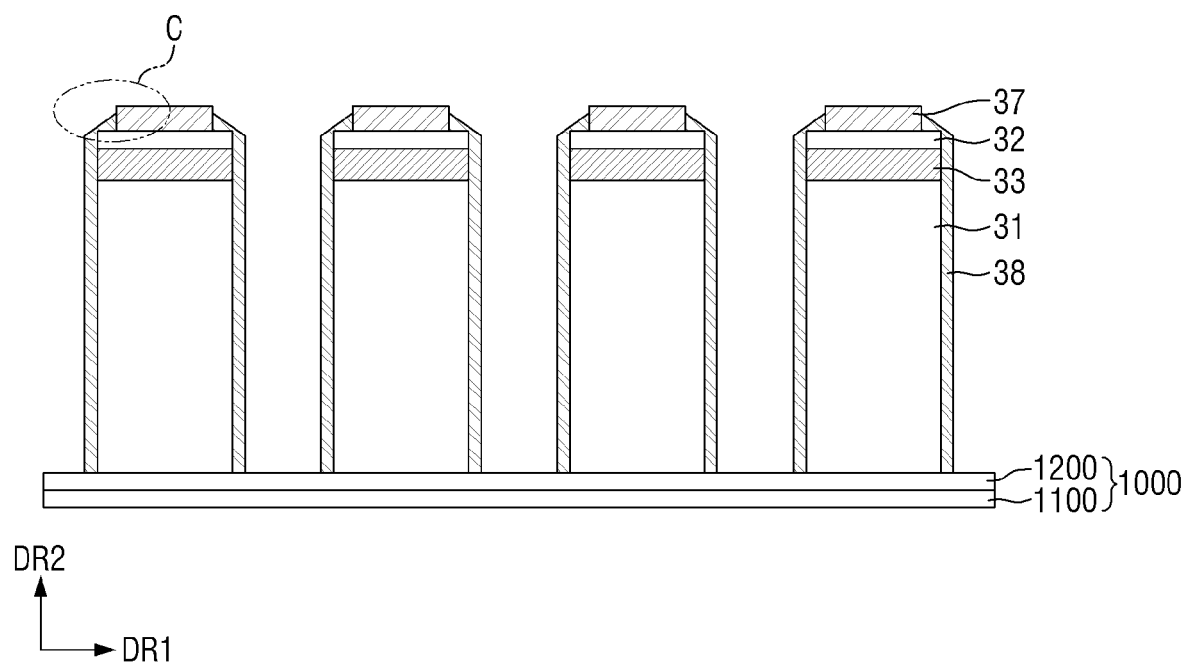

Referring to FIGS. 14 and 15, the insulating material layer 380 may be partially removed to form the element insulating films 38.

A process of forming the element insulating films 38 may include an etching process of partially removing the insulating material layer 380 so that the upper surfaces of the element electrode layers 37 are exposed. The process of partially removing the insulating material layer 380 may be performed through a process such as dry etching or etch-back, which may be anisotropic etching. An inclination angle θ of an outer side surface 38_OS2_R of the second region 38B of the element insulating film 38 measured as a size between a plane LS on which the upper surface 32US of the second semiconductor layer 32 may be positioned and the outer side surface 38_OS2 of the second region 38B of the element insulating film 38 may have a range of 60° or less, and in an embodiment, a range less than 50° through the process of partially removing the insulating material layer 380.

Even in case that the insulating material layer 380 is over-etched through the process, the element insulating film 38 may be maintained to surround the side surface 32SS of the second semiconductor layer 32. Specifically, referring to FIGS. 15 and 16, even though the insulating material layer 380 is over-etched as compared with the outer side surface 38_OS2_R of the second region 38B of the element insulating film 38 formed by normally etching the insulating material layer 380, an outer side surface 38_OS_OE of the second region 38B of the element insulating film 38 that is over-etched may be formed to surround the side surface 32SS of the second semiconductor layer 32.

Referring to FIG. 17, light emitting elements ED may be separated from the lower substrate 1000.

Specifically, a process of separating the light emitting elements ED from the lower substrate 1000 is not particularly limited. For example, a process of separating the light emitting elements ED may be performed by a physical separation method, a chemical separation method, or the like.

FIG. 18 is a schematic plan view of a display device according to an embodiment.

Referring to FIG. 18, a display device 10 may display a moving image or a still image. The display device 10 may refer to all electronic devices that provide display screens. For example, televisions, laptop computers, monitors, billboards, the Internet of Things (IoT) devices, mobile phones, smartphones, tablet personal computers (PCs), electronic watches, smart watches, watch phones, head mounted displays, mobile communication terminals, electronic notebooks, electronic books, portable multimedia players (PMP_s), navigation devices, game machines, digital cameras, camcorders, and the like, which provide display screens, may be included as the display device 10.

The display device 10 may include a display panel providing the display screen. Examples of the display panel may include an inorganic light emitting diode display panel, an organic light emitting display panel, a quantum dot light emitting display panel, a plasma display panel, a field emission display panel, and the like. Hereinafter, a case where the above-described light emitting element ED, specifically, an inorganic light emitting diode display panel is applied as an example of the display panel will be described by way of example, but the disclosure is not limited thereto, and the same technical spirit may be applied to other display panels.

Hereinafter, a third direction DR3, a fourth direction DR4, and a fifth direction DR5 may be defined in the drawings of an embodiment for describing the display device 10. The third direction DR3 and the fourth direction DR4 may be directions perpendicular to each other in a plane. The fifth direction DR5 may be a direction perpendicular to the plane in which the third direction DR3 and the fourth direction DR4 are positioned. The fifth direction DR5 may be perpendicular to each of the third direction DR3 and the fourth direction DR4. In an embodiment for describing the display device 10, the fifth direction DR5 may refer to a thickness direction of the display device 10.

The display device 10 may have a rectangular shape, in plan view, in which the third direction DR3 may be longer than the fourth direction DR4 and which includes long sides and short sides. A corner portion where the long side and the short side of the display device 10 meet in plan view may be right-angled, but is not limited thereto, and may also have a rounded curved shape. The shape of the display device 10 in plan view is not limited to that described above, and may be other shapes such as a square shape, a quadrangular shape with rounded corners (vertices), a polygonal shape, and a circular shape.

A display surface of the display device 10 may be disposed on a side in the fifth direction DR5, which may be the thickness direction. In embodiments for describing the display device 10, unless otherwise stated, the term "upper portion" may refer to a side in the fifth direction DR5 and may refer to a display direction, and the term "upper surface" may refer to a surface toward a side in the fifth direction DR5. The term "lower portion" may refer to another side in the fifth direction DR5 and may refer to an opposite direction to the display direction, and the term "lower surface" may refer to a surface toward the another side in the fifth direction DR5. "Left", "right", "upper", and "lower" may refer to directions when the display device 10 is viewed in plan view. For example, "right side" may refer to a side in the third direction DR3, "left side" may refer to another side in the third direction DR3, "upper side" may refer to a side in the fourth direction DR4, and "lower side" may refer to another side in the fourth direction DR4.

The display device 10 may include a display area DPA and non-display areas NDA. The display area DPA is an area in which a screen may be displayed, and the non-display areas NDA may be areas in which the screen may not be displayed.

A shape of the display area DPA may follow the shape of the display device 10. For example, the shape of the display area DPA may have a rectangular shape in plan view, similar to the overall shape of the display device 10. The display area DPA may occupy substantially the center of the display device 10.

The display area DPA may include pixels PX. The pixels PX may be arranged in a matrix direction. A shape of each pixel PX may be a rectangular or square shape in plan view. However, the disclosure is not limited thereto, and the shape of each pixel PX may be a rhombic shape in which each side may be inclined with respect to a direction. The respective pixels PX may be arranged in a stripe type.

The non-display areas NDA may be disposed around the display area DPA. The non-display areas NDA may entirely or partially surround the display area DPA. In an embodiment, the display area DPA may have a rectangular shape, and the non-display areas NDA may be disposed adjacent to four sides of the display area DPA. The non-display areas NDA may constitute a bezel of the display device 10. Wirings, circuit drivers, or a pad part on which an external device may be mounted, which may be included in the display device 10, may be disposed in the non-display areas NDA.

Figure 19:
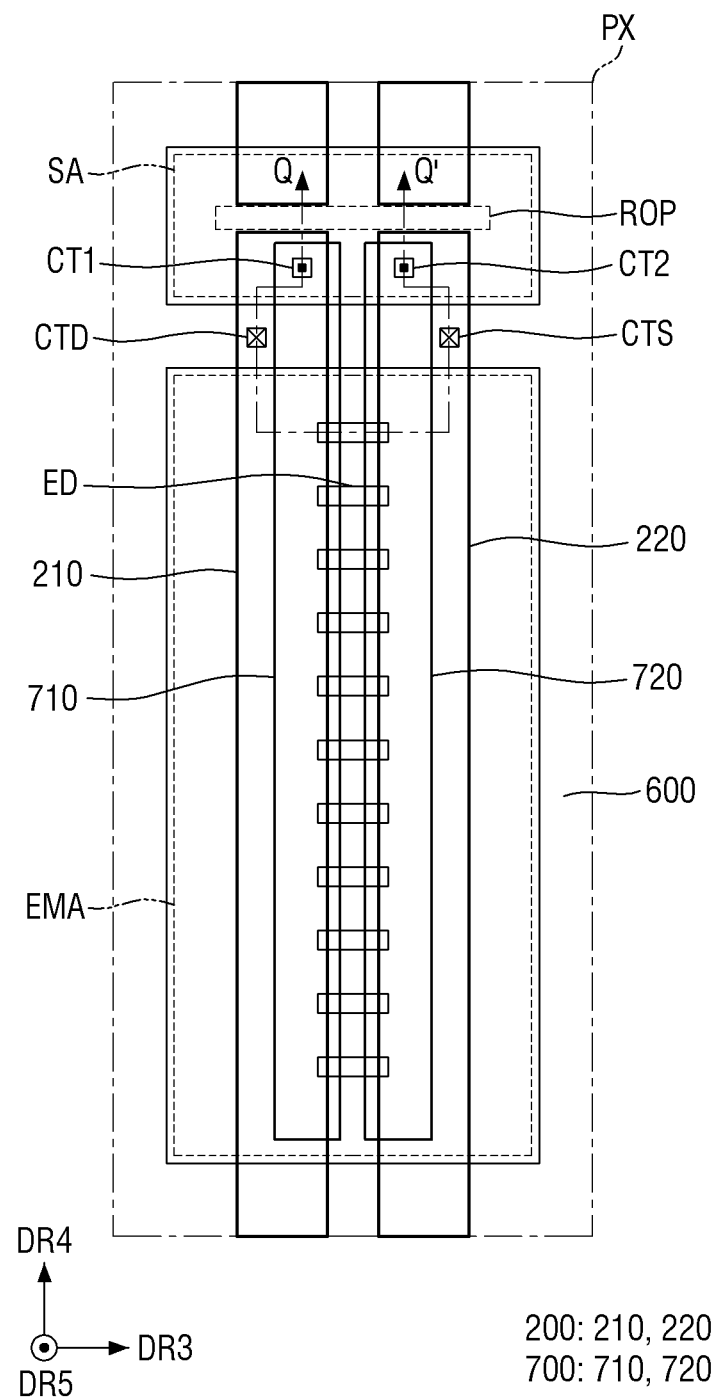
FIG. 19 is a schematic plan view illustrating a pixel of the display device according to an embodiment.
Figure 20:
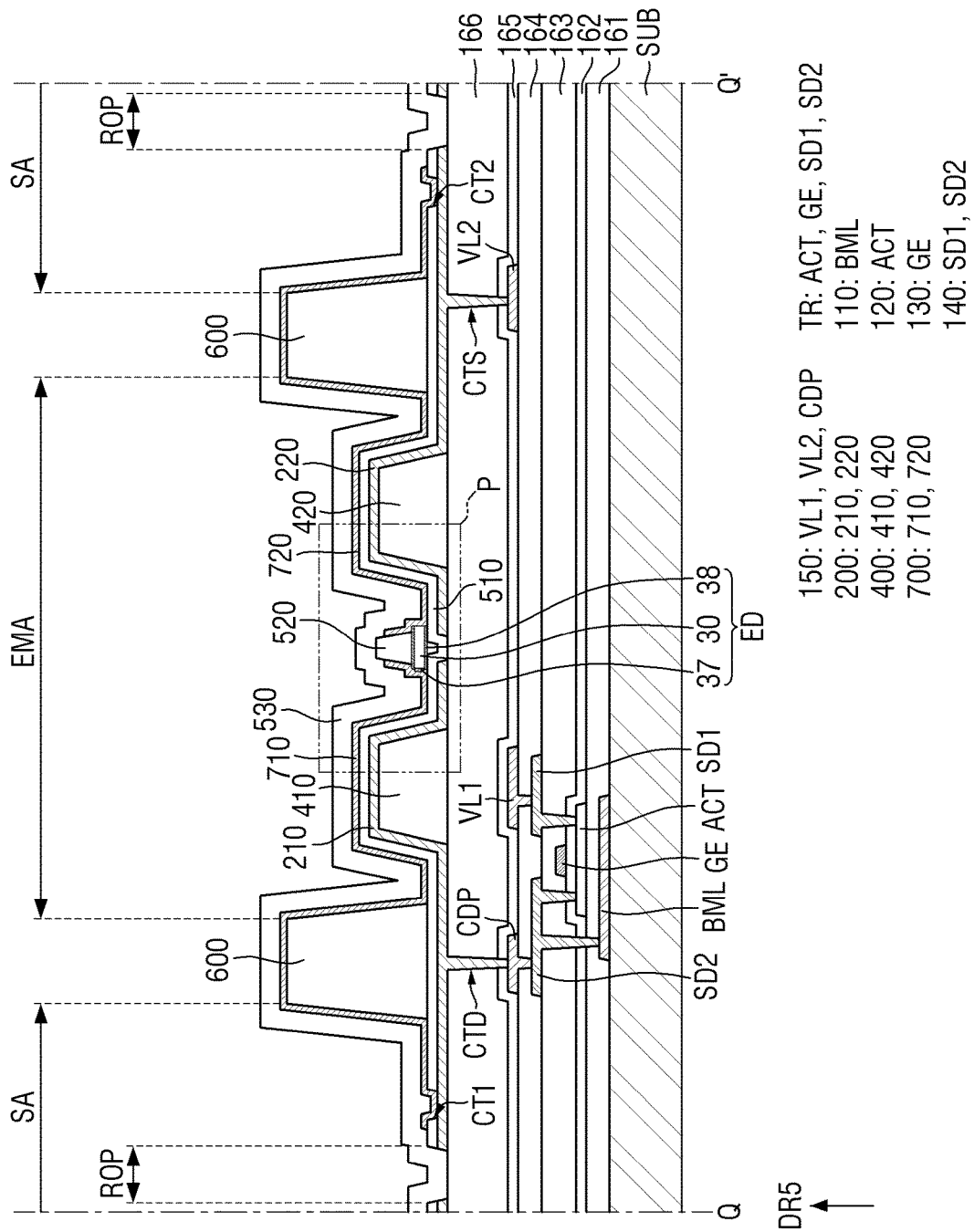
FIG. 20 is a schematic cross-sectional view illustrating an example taken along line Q-Q' of FIG. 19.

FIG. 19 is a schematic plan view illustrating a pixel of the display device according to an embodiment. FIG. 20 is a schematic cross-sectional view illustrating an example taken along line Q-Q' of FIG. 19.

Referring to FIG. 19, each pixel PX of the display device 10 may include an emission area EMA and a non-emission area. The emission area EMA may be defined as an area in which light emitted from light emitting elements ED may be emitted, and the non-emission area may be defined as an area in which the light emitted from the light emitting elements ED may not arrive and thus, the light may not be emitted.

The emission area EMA may include an area in which the light emitting elements ED may be disposed and an area adjacent to the area in which the light emitting elements ED may be disposed. The emission area may further include an area in which the light emitted from the light emitting elements ED may be reflected or refracted by other members and emitted.

Each pixel PX may further include a sub-area SA disposed in the non-emission area. The light emitting elements ED may not be disposed in the sub-area SA. The sub-area SA may be disposed on the upper side of the emission area EMA in plan view of a pixel PX. The sub-area SA may be disposed between emission areas EMA of pixels PX disposed to neighbor to each other in the fourth direction DR4. The sub-area SA may include an area in which an electrode layer 200 and a contact electrode 700 may be electrically connected to each other through contact parts CT1 and CT2.

The sub-area SA may include a separation part ROP. The separation part ROP of the sub-area SA may be an area in which first electrodes 210 and second electrodes 220 included in electrode layers 200 included in the respective pixels PX neighboring to each other along the fourth direction DR4 are separated from each other, respectively.

Referring to FIGS. 19 and 20, the display device 10 may include a substrate SUB, a circuit element layer disposed on the substrate SUB, and a light emitting element layer disposed on the circuit element layer.

The substrate SUB may be an insulating substrate. The substrate SUB may be made of an insulating material such as glass, quartz, and/or a polymer resin. The substrate SUB may be a rigid substrate, but may also be a flexible substrate capable of being bent, folded, and/or rolled.

The circuit element layer may be disposed on the substrate SUB. The circuit element layer may include a lower metal layer 110, a semiconductor layer 120, a first conductive layer 130, a second conductive layer 140, a third conductive layer 150, and insulating films.

The lower metal layer 110 may be disposed on the substrate SUB. The lower metal layer 110 may include a light blocking pattern BML. The light blocking pattern BML may be disposed to cover at least a channel region of an active layer ACT of a transistor TR below the transistor TR. However, the disclosure is not limited thereto, and the light blocking pattern BML may be omitted.

The lower metal layer 110 may include a material blocking light. For example, the lower metal layer 110 may be formed of an opaque metal material blocking transmission of the light.

A buffer layer 161 may be disposed on the lower metal layer 110. The buffer layer 161 may be disposed to cover an entire surface of the substrate SUB on which the lower metal layer 110 may be disposed. The buffer layer 161 may serve to protect transistors from moisture permeating through the substrate SUB vulnerable to moisture permeation.

The semiconductor layer 120 may be disposed on the buffer layer 161. The semiconductor layer 120 may include the active layer ACT of the transistor TR. The active layer ACT of the transistor TR may be disposed to overlap the light blocking pattern BML, of the lower metal layer 110, as described above.

The semiconductor layer 120 may include polycrystalline silicon, single crystal silicon, an oxide semiconductor, or the like, or a combination thereof. In an embodiment, in case that the semiconductor layer 120 includes the polycrystalline silicon, the polycrystalline silicon may be formed by crystallizing amorphous silicon. In case that the semiconductor layer 120 includes the polycrystalline silicon, the active layer ACT of the transistor TR may include doped regions doped with impurities and a channel region between the doped regions. In another embodiment, the semiconductor layer 120 may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), or the like, or a combination thereof.

A gate insulating film 162 may be disposed on the semiconductor layer 120. The gate insulating film 162 may function as a gate insulating film of the transistor. The gate insulating film 162 may be formed as multiple layers in which inorganic layers including at least one of inorganic materials such as silicon oxide ($SiO_x$), silicon nitride ($SiN_x$), and silicon oxynitride ($SiO_xN_y$) may be alternately stacked on each other.

The first conductive layer 130 may be disposed on the gate insulating film 162. The first conductive layer 130 may include a gate electrode GE of the transistor TR. The gate electrode GE may be disposed to overlap the channel region of the active layer ACT in the fifth direction DR5, which may be the thickness direction of the substrate SUB.

A first interlayer insulating film 163 may be disposed on the first conductive layer 130. The first interlayer insulating film 163 may be disposed to cover the gate electrode GE. The first interlayer insulating film 163 may function as an insulating film between the first conductive layer 130 and other layers disposed on the first conductive layer 130, and protect the first conductive layer 130.

The second conductive layer 140 may be disposed on the first interlayer insulating film 163. The second conductive layer 140 may include a drain electrode SD1 of the transistor TR and a source electrode SD2 of the transistor TR.

The drain electrode SD1 and the source electrode SD2 of the transistor TR may be electrically connected to both end areas of the active layer ACT of the transistor TR through contacts holes penetrating through the first interlayer insulating film 163 and the gate insulating film 162, respectively. The source electrode SD2 of the transistor TR may be electrically connected to the light blocking pattern BML, of the lower metal layer 110 through another contact hole penetrating through the first interlayer insulating film 163, the gate insulating film 162, and the buffer layer 161.

A second interlayer insulating film 164 may be disposed on the second conductive layer 140. The second interlayer insulating film 164 may be disposed to cover the drain electrode SD1 of the transistor TR and the source electrode SD2 of the transistor TR. The second interlayer insulating film 164 may function as an insulating film between the second conductive layer 140 and other layers disposed on the second conductive layer 140, and protect the second conductive layer 140.

The third conductive layer 150 may be disposed on the second interlayer insulating film 164. The third conductive layer 150 may include a first voltage line VL1, a second voltage line VL2, and a conductive pattern CDP.

The first voltage line VL1 may overlap at least a portion of the drain electrode SD1 of the transistor TR in the thickness direction of the substrate SUB. A high potential voltage (or a first source voltage) supplied to the transistor TR may be applied to the first voltage line VL1.

The second voltage line VL2 may be electrically connected to the second electrode 220 through a second electrode contact hole CTS penetrating through a via layer 166 and a passivation layer 165 to be described later. A low potential voltage (or a second source voltage) lower than the high potential voltage supplied to the first voltage line VL1 may be applied to the second voltage line VL2. For example, the high potential voltage (or the first source voltage) supplied to the transistor TR may be applied to the first voltage line VL1, and the low potential voltage (or the second source voltage) lower than the high potential voltage supplied to the first voltage line VL1 may be applied to the second voltage line VL2.

The conductive pattern CDP may be electrically connected to the source electrode SD2 of the transistor TR. The conductive pattern CDP may be electrically connected to the source electrode SD2 of the transistor TR through a contact hole penetrating through the second interlayer insulating film 164. The conductive pattern CDP may be electrically connected to the first electrode 210 through a first electrode contact hole CTD penetrating through a via layer 166 and a passivation layer 165 to be described later. The transistor TR may transfer the first source voltage applied from the first voltage line VL1 to the first electrode 210 through the conductive pattern CDP.

The passivation layer 165 may be disposed on the third conductive layer 150. The passivation layer 165 may be disposed to cover the third conductive layer 150. The passivation layer 165 may serve to protect the third conductive layer 150.

Each of the buffer layer 161, the gate insulating film 162, the first interlayer insulating film 163, the second interlayer insulating film 164, and the passivation layer 165 described above may be formed as inorganic layers that are alternately stacked on each other. For example, each of the buffer layer 161, the gate insulating film 162, the first interlayer insulating film 163, the second interlayer insulating film 164, and the passivation layer 165 described above may be formed as a double layer in which inorganic layers including at least one of silicon oxide ($SiO_x$), silicon nitride ($SiN_x$), and silicon oxynitride ($SiO_xN_y$) are stacked on each other or multiple layers in which these layers are alternately stacked on each other. However, the disclosure is not limited thereto, and each of the buffer layer 161, the gate insulating film 162, the first interlayer insulating film 163, the second interlayer insulating film 164, and the passivation layer 165 described above may also be formed as one inorganic layer including the insulating material described above.

The via layer 166 may be disposed on the passivation layer 165. The via layer 166 may include an organic insulating material, for example, an organic material such as polyimide (PI). The via layer 166 may serve to planarize a surface. Accordingly, an upper surface (or a surface) of the via layer 166 on which a light emitting element layer to be described later may be disposed may be substantially flat regardless of a shape or the presence or absence of a pattern disposed below the via layer 166.

The light emitting element layer may be disposed on the circuit element layer. The light emitting element layer may be disposed on the via layer 166. The light emitting element layer may include a first bank 400, an electrode layer 200, a first insulating layer 510, a second bank 600, light emitting elements ED and a contact electrode 700.

The first bank 400 may be disposed on the via layer 166 in the emission area EMA. The first bank 400 may be directly disposed on a surface of the via layer 166. The first bank 400 may have a structure in which at least a portion thereof protrudes upward (e.g., toward a side in the fifth direction DR5) with respect to a surface of the via layer 166. The protruding portion of the first bank 400 may have inclined side surfaces. The first bank 400 may have the inclined surfaces to serve to change a traveling direction of light emitted from the light emitting elements ED and traveling toward the side surfaces of the first bank 400 into an upward direction (e.g., a display direction).

The first bank 400 may include a first sub-bank 410 and a second sub-bank 420 spaced apart from each other. The first sub-bank 410 and the second sub-bank 420 spaced apart from each other may provide a space in which the light emitting elements ED are disposed, and assist in a role of reflective partition walls changing the traveling direction of the light emitted from the light emitting elements ED into the display direction.

It has been illustrated in FIG. 20 that side surfaces of the first bank 400 may be inclined in a linear shape, but the disclosure is not limited thereto. For example, the side surfaces (or outer surfaces) of the first bank 400 may have a curved semi-circular or semi-elliptical shape. In an embodiment, the first bank 400 may include an organic insulating material such as polyimide (PI), but is not limited thereto.

The electrode layer 200 may have a shape in which it extends in a direction, and may be disposed to cross the emission area EMA and the sub-area SA. The electrode layer 200 may transfer electrical signals applied from the circuit element layer to the light emitting elements ED in order for the light emitting elements ED to emit light. The electrode layer 200 may be used to generate an electric field used in a process of aligning the light emitting elements ED.

The electrode layer 200 may be disposed on the first bank 400 and the via layer 166 exposed by the first bank 400. The electrode layer 200 may be disposed on the first bank 400 in the emission area EMA, and may be disposed on the via layer 166 exposed by the first bank 400 in the non-emission area.

The electrode layer 200 may include a first electrode 210 and a second electrode 220. The first electrode 210 and the second electrode 220 may be spaced apart from each other.

The first electrode 210 may be disposed on the left side of each pixel PX in plan view. The first electrode 210 may have a shape in which it extends in the fourth direction DR4 in plan view. The first electrode 210 may be disposed to cross the emission area EMA and the sub-area SA. The first electrode 210 may extend in the fourth direction DR4 in plan view, but may be separated from a first electrode 210 of a pixel PX neighboring in the fourth direction DR4 in the separation part ROP of the sub-area SA.

The second electrode 220 may be spaced apart from the first electrode 210 in the third direction DR3. The second electrode 220 may be disposed on the right side of each pixel PX in plan view. The second electrode 220 may have a shape in which it extends in the fourth direction DR4 in plan view. The second electrode 220 may be disposed to cross the emission area EMA and the sub-area SA. The second electrode 220 may extend in the fourth direction DR4 in plan view, but may be separated from a second electrode 220 of the pixel PX neighboring in the fourth direction DR4 in the separation part ROP of the sub-area SA.

Specifically, in the emission area EMA, the first electrode 210 may be disposed on the first sub-bank 410, and the second electrode 220 may be disposed on the second sub-bank 420. The first electrode 210 may extend outward from the first sub-bank 410 to be also disposed on the via layer 166 exposed by the first sub-bank 410. Similarly, the second electrode 220 may extend outward from the second sub-bank 420 to be also disposed on the via layer 166 exposed by the second sub-bank 420. The first electrode 210 and the second electrode 220 may be spaced apart from and face each other in a spaced area between the first sub-bank 410 and the second sub-bank 420. The via layer 166 may be exposed in an area where the first electrode 210 and the second electrode 220 are spaced apart from and face each other.

The first electrode 210 may be spaced apart from a first electrode 210 of another pixel PX adjacent in the fourth direction DR4 with the separation part ROP interposed therebetween in the sub-area SA. Similarly, the second electrode 220 may be spaced apart from a second electrode 220 of another pixel PX adjacent in the fourth direction DR4 with the separation part ROP interposed therebetween in the sub-area SA. Accordingly, the first electrode 210 and the second electrode 220 may expose the via layer 166 in the separation part ROP of the sub-area SA.

The first electrode 210 may be electrically connected to the conductive pattern CDP of the circuit element layer through the first electrode contact hole CTD penetrating through the via layer 166 and the passivation layer 165. Specifically, the first electrode 210 may be in contact with an upper surface of the conductive pattern CDP exposed by the first electrode contact hole CTD. The first source voltage applied from the first voltage line VL1 may be transferred to the first electrode 210 through the conductive pattern CDP.

The second electrode 220 may be electrically connected to the second voltage line VL2 of the circuit element layer through the second electrode contact hole CTS penetrating through the via layer 166 and the passivation layer 165. Specifically, the second electrode 220 may be in contact with an upper surface of the second voltage line VL2 exposed by the second electrode contact hole CTS. The second source voltage applied from the second voltage line VL2 may be transferred to the second electrode 220.

The electrode layer 200 may include a conductive material having high reflectivity. For example, the electrode layer 200 may include a metal such as silver (Ag), copper (Cu), or aluminum (Al), or include an alloy including aluminum (Al), nickel (Ni), lanthanum (La), or the like, as the material having the high reflectivity. The electrode layer 200 may reflect the light emitted from the light emitting elements ED and traveling toward the side surfaces of the first bank 400 in the upward direction of each pixel PX.

However, the disclosure is not limited thereto, and the electrode layer 200 may further include a transparent conductive material. For example, the electrode layer 200 may include a material such as ITO, IZO, or ITZO. In some embodiments, the electrode layer 200 may have a structure in which one or more layers made of the transparent conductive material and one or more layers made of the metal having the high reflectivity are stacked on each other or may be formed as one layer including the transparent conductive material and the metal having the high reflectivity. For example, the electrode layer 200 may have a stacked structure such as ITO/Ag/ITO, ITO/Ag/IZO, or ITO/Ag/ITZO/IZO.

The first insulating layer 510 may be disposed on the via layer 166 on which the electrode layer 200 may be formed. The first insulating layer 510 may protect the electrode layer 200 and insulate the first electrode 210 and the second electrode 220 from each other.

The first insulating layer 510 may include an inorganic insulating material. For example, the first insulating layer 510 may include at least one of inorganic insulating materials such as silicon oxide ($SiO_x$), silicon nitride ($SiN_x$), silicon oxynitride ($SiO_xN_y$), aluminum oxide ($Al_xO_y$), and aluminum nitride (AlN). The first insulating layer 510 made of the inorganic insulating material may have a surface shape reflecting a pattern shape of the electrode layer 200 disposed therebelow. For example, the first insulating layer 510 may have a step structure according to a shape of the electrode layer 200 disposed below the first insulating layer 510. Specifically, the first insulating layer 510 may include a step structure in which a portion of an upper surface thereof is recessed in an area where the first electrode 210 and the second electrode 220 are spaced apart from and face each other. Accordingly, a height of an upper surface of the first insulating layer 510 disposed on an upper portion of the first electrode 210 and an upper portion of the second electrode 220 may be greater than a height of an upper surface of the first insulating layer 510 disposed on an upper portion of the via layer 166 on which the first electrode 210 and the second electrode 220 are not disposed. In the specification, a relative comparison of a height of an upper surface of any layer may be made by a height measured from a flat reference surface (e.g., an upper surface of the via layer 166) that may not have a lower step structure.

The first insulating layer 510 may include a first contact part CT1 exposing a portion of an upper surface of the first electrode 210 and a second contact part CT2 exposing a portion of an upper surface of the second electrode 220, in the sub-area SA. The first electrode 210 may be electrically connected to a first contact electrode 710 to be described later through the first contact part CT1 penetrating through the first insulating layer 510 in the sub-area SA, and the second electrode 220 may be electrically connected to a second contact electrode 720 to be described later through the second contact part CT2 penetrating through the first insulating layer 510 in the sub-area SA.

The second bank 600 may be disposed on the first insulating layer 510. The second bank 600 may be disposed in a lattice pattern in plan view by including portions extending in the third direction DR3 and the fourth direction DR4 in plan view.

The second bank 600 may be disposed across boundaries between the respective pixels PX to divide neighboring pixels PX, and may divide the emission area EMA and the sub-area SA. The second bank 600 may be formed to have a greater height than the first bank 400 to allow ink in which the light emitting elements ED may be dispersed to be jetted into the emission area EMA without being mixed in adjacent pixels PX in an inkjet printing process for aligning the light emitting elements ED among processes of manufacturing the display device 10.

The light emitting elements ED may be disposed in the emission area EMA. The light emitting elements ED may not be disposed in the sub-area SA.

The light emitting elements ED may be disposed on the first insulating layer 510 between the first sub-bank 410 and the second sub-bank 420. The light emitting elements ED may be disposed between the first electrode 210 and the second electrode 220 on the first insulating layer 510.

The light emitting elements ED may have a shape in which they extend in a direction, and may be disposed so that both ends thereof are put on the first electrode 210 and the second electrode 220, respectively. For example, the light emitting elements ED may be disposed so that first ends thereof are put on the first electrode 210 and second ends thereof are put on the second electrode 220.

A length of each light emitting element ED (i.e., a length of the light emitting element ED in the third direction DR3 in FIG. 19) may be smaller than the shortest interval between the first sub-bank 410 and the second sub-bank 420 spaced apart from each other in the third direction DR3. The length of each light emitting element ED may be greater than the shortest distance between the first electrode 210 and the second electrode 220 spaced apart from each other in the third direction DR3. Since an interval between the first sub-bank 410 and the second sub-bank 420 in the third direction DR3 may be greater than the length of each light emitting element ED and an interval between the first electrode 210 and the second electrode 220 in the third direction DR3 may be smaller than the length of each light emitting element ED, the light emitting elements ED may be disposed in an area between the first sub-bank 410 and the second sub-bank 420 so that both ends thereof are put on the first electrode 210 and the second electrode 220, respectively.

The light emitting elements ED may be disposed to be spaced apart from each other along the fourth direction DR4 in which the first electrode 210 and the second electrode 220 extend, and may be aligned substantially parallel to each other.

A second insulating layer 520 may be disposed on the light emitting elements ED. The second insulating layer 520 may be partially disposed on the light emitting elements ED so as to expose both ends of the light emitting elements ED.

The second insulating layer 520 may be disposed to partially surround outer surfaces of the light emitting elements ED, and may be disposed so as not to cover first ends and second ends of the light emitting elements ED.

Portions of the second insulating layer 520 disposed on the light emitting elements ED may be disposed to extend in the fourth direction DR4 on the first insulating layer 510 in plan view to form a linear or island-shaped pattern in each pixel PX. The second insulating layer 520 may protect the light emitting elements ED and fix the light emitting elements ED in the processes of manufacturing the display device 10. The second insulating layer 520 may be disposed to fill spaces between the light emitting elements ED and the first insulating layer 510 below the light emitting elements ED.

The contact electrode 700 may be disposed on the second insulating layer 520. The contact electrode 700 may be disposed on the first insulating layer 510 on which the light emitting elements ED are disposed. The contact electrode 700 may include a first contact electrode 710 and a second contact electrode 720 spaced apart from each other.

The first contact electrode 710 may be disposed on the first electrode 210 in the emission area EMA. The first contact electrode 710 may have a shape in which it extends in the fourth direction DR4 on the first electrode 210. The first contact electrode 710 may be in contact with each of the first electrode 210 and first ends of the light emitting elements ED.

The first contact electrode 710 may be in contact with the first electrode 210 exposed by the first contact part CT1 penetrating through the first insulating layer 510 in the sub-area SA, and be in contact with first ends of the light emitting elements ED in the emission area EMA. For example, the first contact electrode 710 may serve to electrically connect the first electrode 210 and first ends of the light emitting elements ED to each other.

The second contact electrode 720 may be disposed on the second electrode 220 in the emission area EMA. The second contact electrode 720 may have a shape in which it extends in the fourth direction DR4 on the second electrode 220. The second contact electrode 720 may be in contact with each of the second electrode 220 and second ends of the light emitting elements ED.

The second contact electrode 720 may be in contact with the second electrode 220 exposed by the second contact part CT2 penetrating through the first insulating layer 510 in the sub-area SA, and be in contact with the second ends of the light emitting elements ED in the emission area EMA. For example, the second contact electrode 720 may serve to electrically connect the second electrode 220 and the second ends of the light emitting elements ED to each other.

The first contact electrode 710 and the second contact electrode 720 may be spaced apart from each other on the light emitting element ED. Specifically, the first contact electrode 710 and the second contact electrode 720 may be spaced apart from each other with the second insulating layer 520 interposed therebetween. The first contact electrode 710 and the second contact electrode 720 may be electrically insulated from each other.

The first contact electrode 710 and the second contact electrode 720 may include the same material. For example, each of the first contact electrode 710 and the second contact electrode 720 may include a conductive material. For example, the first contact electrode 710 and the second contact electrode 720 may include ITO, IZO, ITZO, aluminum (Al), or the like, or a combination thereof. As an example, each of the first contact electrode 710 and the second contact electrode 720 may include a transparent conductive material. Since each of the first contact electrode 710 and the second contact electrode 720 includes the transparent conductive material, the light emitted from the light emitting elements ED may be transmitted through the first contact electrode 710 and the second contact electrode 720 and travel toward the first electrode 210 and the second electrode 220, and may be reflected from surfaces of the first electrode 210 and the second electrode 220.

The first contact electrode 710 and the second contact electrode 720 may include the same material and may be formed as the same layer. The first contact electrode 710 and the second contact electrode 720 may be simultaneously formed through the same process.

A third insulating layer 530 may be disposed on the contact electrode 700. The third insulating layer 530 may cover the light emitting element layer disposed therebelow. The third insulating layer 530 may cover the first bank 400, the electrode layer 200, the first insulating layer 510, the light emitting elements ED, and the contact electrode 700. The third insulating layer 530 may be disposed on the second bank 600 to also cover the second bank 600.

The third insulating layer 530 may serve to protect the light emitting element layer disposed therebelow from foreign materials such as moisture/oxygen or dust particles. The third insulating layer 530 may serve to protect the first bank 400, the electrode layer 200, the first insulating layer 510, the light emitting elements ED, and the contact electrode 700.

Figure 21:
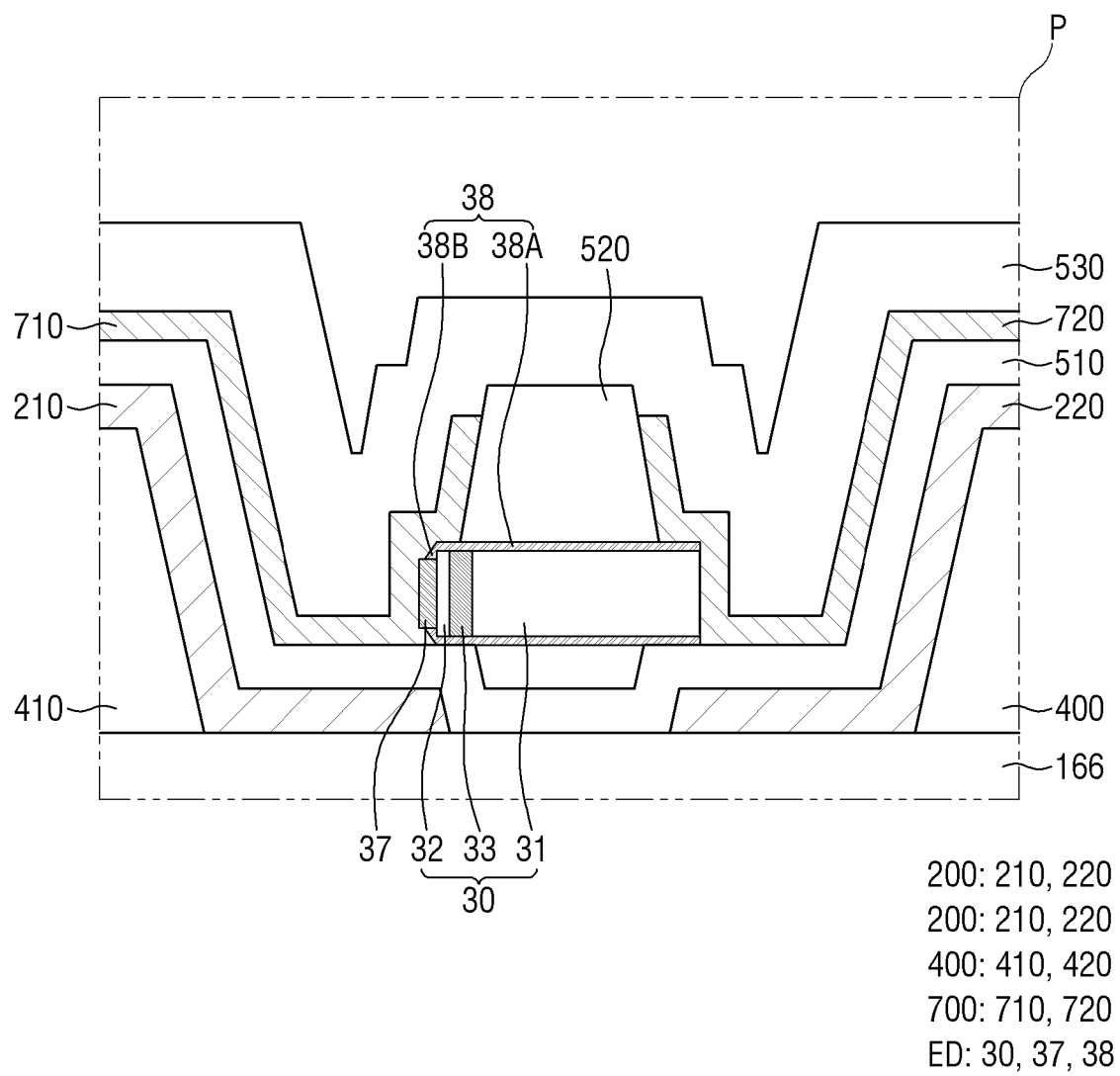
FIG. 21 is an enlarged schematic view illustrating an example of portion P of FIG. 20.

FIG. 21 is an enlarged schematic view illustrating an example of portion P of FIG. 20.

Referring to FIG. 21, the light emitting element ED may be disposed so that an extension direction of the light emitting element ED is parallel to a surface of the substrate SUB. The semiconductor layers included in the light emitting element ED may be sequentially disposed along a direction parallel to an upper surface of the substrate SUB (or an upper surface of the via layer 166). For example, the first semiconductor layer 31, the element active layer 33, the second semiconductor layer 32, and the element electrode layer 37 of the light emitting element ED may be sequentially disposed to be parallel to the upper surface of the substrate SUB.

Specifically, in the light emitting element ED, in a cross section crossing both ends of the light emitting element ED, the first semiconductor layer 31, the element active layer 33, the second semiconductor layer 32, and the element electrode layer 37 may be sequentially formed in a direction horizontal to the upper surface of the substrate SUB.

The light emitting element ED may be disposed so that an end thereof is put on the first electrode 210 and another end thereof is put on the second electrode 220. However, the disclosure is not limited thereto, and the light emitting element ED may also be disposed so that an end thereof is put on the second electrode 220 and the another end thereof is put on the first electrode 210. In an embodiment, an end of the light emitting element ED on the side on which the second semiconductor layer 32 and the element electrode layer 37 may be positioned may be put on the first electrode 210, and another end of the light emitting element ED on the side on which the first semiconductor layer 31 may be positioned may be put on the second electrode 220.

The second insulating layer 520 may be disposed on the light emitting elements ED. The second insulating layer 520 may be disposed to surround an outer surface of the light emitting element ED. The second insulating layer 520 may be disposed on the element insulating film 38 of the light emitting element ED, and may surround an outer surface of the element insulating film 38 of the light emitting element ED toward the display direction DR5.

In an area in which the light emitting element ED is disposed, the second insulating layer 520 may be disposed to surround the outer surface of the light emitting element ED (specifically, the element insulating film 38 of the light emitting element ED), and in an area in which the light emitting element ED may not be disposed, the second insulating layer 520 may be disposed on the first insulating layer 510 exposed by the light emitting element ED.

The first contact electrode 710 may be in contact with an end of the light emitting element ED exposed by the second insulating layer 520. Specifically, the first contact electrode 710 may be disposed to surround an end surface of the light emitting element ED exposed by the second insulating layer 520. The first contact electrode 710 may be in contact with the element insulating film 38 and the element electrode layer 37 of the light emitting element ED.

In the light emitting element ED according to an embodiment, a diameter of the element electrode layer 37 may be smaller than a diameter of the second semiconductor layer 32. Accordingly, a surface of the second semiconductor layer 32 facing the element electrode layer 37 may be exposed by the element electrode layer 37, and the element insulating film 38 may also be disposed on a surface of the second semiconductor layer 32 exposed by the element electrode layer 37. The element insulating film 38 may be disposed to completely surround the side surface of the second semiconductor layer 32.

The second region 38B of the element insulating film 38 surrounding the element electrode layer 37 may be formed to be inclined at an angle. Since the second region 38B of the element insulating film 38 may be formed to be inclined at the angle, the element insulating film 38 may completely cover the second semiconductor layer 32. The second region 38B of the element insulating film 38 may cover a portion of the side surface of the element electrode layer 37, but may expose another portion of the side surface of the element electrode layer 37. The second region 38B of the element insulating film 38 may completely expose the upper surface of the element electrode layer 37.

The first contact electrode 710 may be in contact with the upper surface and the side surface of the element electrode layer 37 exposed by the element insulating film 38. The element insulating film 38 may be formed to completely cover the second semiconductor layer 32, and accordingly, the first contact electrode 710 may not be in contact with the second semiconductor layer 32. The first contact electrode 710 may be in contact with at least the outer peripheral surface of the second region 38B of the element insulating film 38.

The second contact electrode 720 may be in contact with another end of the light emitting element ED exposed by the second insulating layer 520. Specifically, the second contact electrode 720 may be disposed to surround the another end surface of the light emitting element ED exposed by the second insulating layer 520. The second contact electrode 720 may be in contact with the element insulating film 38 and the first semiconductor layer 31 of the light emitting element ED. For example, the element insulating film 38 may expose the lower surface of the first semiconductor layer 31. Accordingly, the second contact electrode 720 may be in contact with the lower surface of the first semiconductor layer 31 and the outer peripheral surface of the first region 38A of the element insulating film 38 surrounding the first semiconductor layer 31.

In an embodiment, the element insulating film 38 may be formed to completely cover a surface of the second semiconductor layer 32, and accordingly, the occurrence of a defect such as a short-circuit due to exposure of the second semiconductor layer 32 may be prevented.

In case that the display device 10 is driven, some light among the light generated from the element active layer 33 of the light emitting element ED and traveling toward the second semiconductor layer 32 may not be transmitted through the element electrode layer 37, such that an amount of the light emitted to the outside of the light emitting element ED may be increased. Accordingly, luminance of the display device 10 may be improved.

The first contact electrode 710 and the second contact electrode 720 may be spaced apart from each other with the second insulating layer 520 interposed therebetween. The first contact electrode 710 and the second contact electrode 720 may expose at least a portion of an upper surface of the second insulating layer 520.

The first contact electrode 710 and the second contact electrode 720 may be formed at the same layer and may include the same material. For example, the first contact electrode 710 and the second contact electrode 720 may be simultaneously formed through one mask process. Accordingly, an additional mask process for forming the first contact electrode 710 and the second contact electrode 720 may not be required, and thus, efficiency of the processes of manufacturing the display device 10 may be improved.

Figure 22:
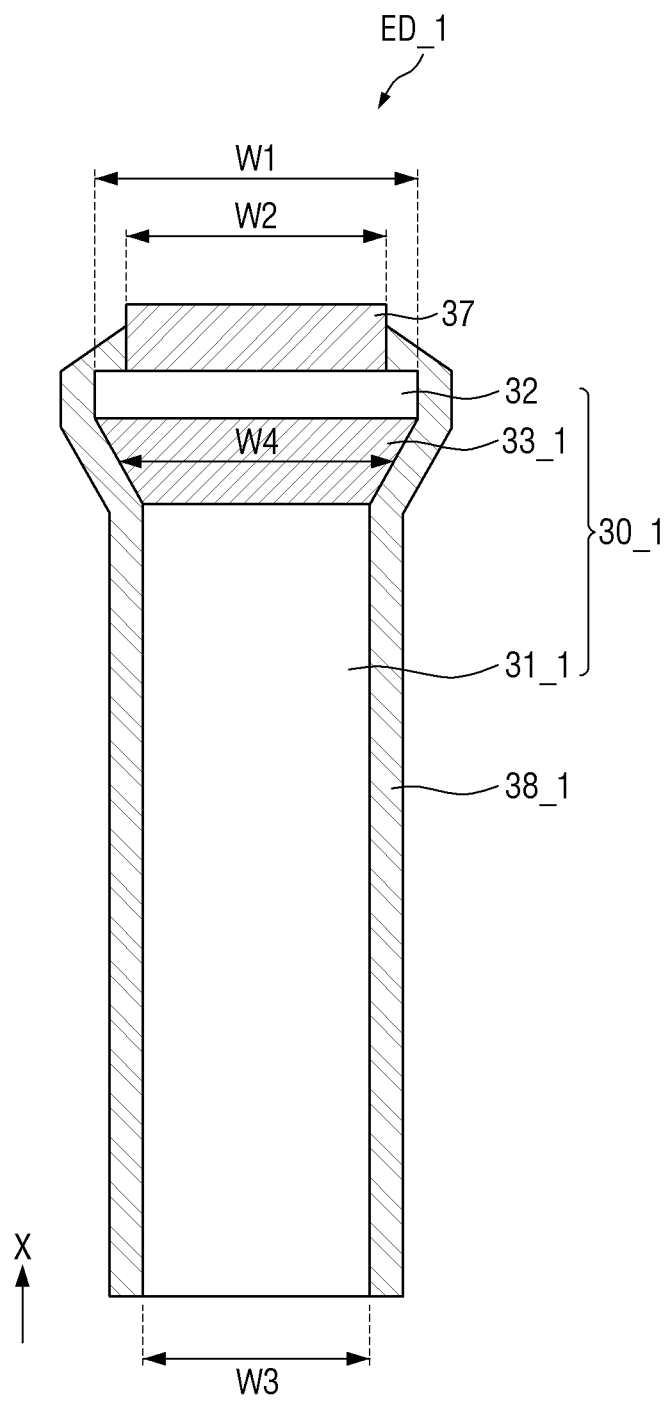
FIG. 22 is a schematic cross-sectional view of a light emitting element according to another embodiment.

FIG. 22 is a schematic cross-sectional view of a light emitting element according to another embodiment.

Referring to FIG. 22, a light emitting element ED__1 according to an embodiment may be different from the light emitting element ED according to an embodiment of FIG. 2 at least in that it may include a light emitting element core 30_1 having different diameters along a direction X.

Specifically, a width W3 of a first semiconductor layer 31_1 may be smaller than a width W1 of a second semiconductor layer 32. A width W4 of the element active layer 33_1 may increase along a direction X. The light emitting element ED__1 according to an embodiment may be formed by adjusting a process time in the third etching process $3^{rd}$ ETCH of etching the side surface of the light emitting element core 30 described above. The light emitting element ED__1 may be formed using a difference in etch selectivity between the first semiconductor layer 31_1 and the second semiconductor layer 32 with respect to an etchant used in the third etching process $3^{rd}$ ETCH. For example, in case that an etch rate of the first semiconductor layer 31_1 with respect to the etchant is higher than an etch rate of the second semiconductor layer 32 with respect to the etchant, the first semiconductor layer 31_1 may be etched more, such that the light emitting element ED__1 (including the insulation layer 38_1) may be formed as illustrated in FIG. 22.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A light emitting element comprising:
  a light emitting element core extending in a direction and including:
    a first semiconductor layer;
    a second semiconductor layer disposed on the first semiconductor layer; and an element active layer disposed between the first semiconductor layer and the second semiconductor layer;

an element electrode layer disposed on the second semiconductor layer of the light emitting element core; and an element insulating film surrounding a side surface of the light emitting element core and a side surface of the element electrode layer, wherein the element electrode layer overlaps the second semiconductor layer in the direction the light emitting element core extends, an area of the element electrode layer in plan view is smaller than an area of the second semiconductor layer in plan view, the element insulating film completely exposes a surface of the element electrode layer, the surface being opposite to another surface of the element electrode layer facing the second semiconductor layer, and the element insulating film exposes only a portion of the side surface of the element electrode layer.

2. The light emitting element of claim 1, wherein the area of the element electrode layer in plan view is in a range of 75% to 95% of the area of the second semiconductor layer in plan view.

3. The light emitting element of claim 1, wherein the element insulating film surrounding the element electrode layer has an outer peripheral surface inclined with respect to the direction the light emitting element core extends.

4. The light emitting element of claim 3, wherein an inclination angle of the outer peripheral surface of the element insulating film surrounding the element electrode layer is in a range of 60° or less.

5. The light emitting element of claim 1, wherein a surface of the second semiconductor layer facing the element electrode layer includes:

a first region that overlaps the another surface of the element electrode layer; and a second region that does not overlap the another surface of the element electrode layer, and the element insulating film covers the second region of the surface of the second semiconductor layer.

6. The light emitting element of claim 5, wherein the element insulating film is in direct contact with the second region of the surface of the second semiconductor layer.

7. The light emitting element of claim 1, wherein the element insulating film includes:

a first region surrounding the side surface of the light emitting element core; and a second region surrounding an other portion of the side surface of the element electrode layer, and the first region of the element insulating film and the second region of the element insulating film are physically connected to each other.

8. A light emitting element comprising:

a light emitting element core extending in a direction and including:

a first semiconductor layer;

a second semiconductor layer disposed on the first semiconductor layer; and an element active layer disposed between the first semiconductor layer and the second semiconductor layer;

an element electrode layer disposed on the second semiconductor layer of the light emitting element core; and an element insulating film including:

a first region surrounding a side surface of the light emitting element core; and a second region surrounding a side surface of the element electrode layer, wherein the second region of the element insulating film includes an outer peripheral surface inclined with respect to the direction the light emitting element core extends, and an inclination angle of the outer peripheral surface of the second region of the element insulating film is in a range of 60° or less.

9. The light emitting element of claim 8, wherein the second region of the element insulating film completely exposes a surface of the element electrode layer, the surface being opposite surface to another surface of the element electrode layer facing the second semiconductor layer.

10. The light emitting element of claim 9, wherein the second region of the element insulating film exposes a portion of the side surface of the element electrode layer, and the side surface of the element electrode layer exposed by the second region of the element insulating film is disposed adjacent to the surface of the element electrode layer.

11. The light emitting element of claim 8, wherein the first region of the element insulating film completely surrounds a side surface of the element active layer and a side surface of the second semiconductor layer.

12. The light emitting element of claim 8, wherein the element electrode layer overlaps the second semiconductor layer in the direction the light emitting element core extends, and an area of the element electrode layer in plan view is smaller than an area of the second semiconductor layer in plan view.

13. The light emitting element of claim 12, wherein the area of the element electrode layer in plan view is in a range of 75% to 95% of the area of the second semiconductor layer in plan view.

14. The light emitting element of claim 12, wherein a surface of the second semiconductor layer facing the element electrode layer includes:

a first region that overlaps the element electrode layer; and a second region that does not overlap the element electrode layer, and the second region of the element insulating film covers the second region of the surface of the second semiconductor layer.

15. The light emitting element of claim 14, wherein the second region of the element insulating film is in direct contact with the second region of the surface of the second semiconductor layer.

16. A display device comprising:

a first electrode and a second electrode that are disposed on a substrate and spaced apart from each; and a light emitting element disposed between the first electrode and the second electrode, the light emitting element including:

a light emitting element core extending in a direction and including:

a first semiconductor layer;

a second semiconductor layer disposed on the first semiconductor layer; and an element active layer disposed between the first semiconductor layer and the second semiconductor layer;

an element electrode layer disposed on the second semiconductor layer of the light emitting element core; and an element insulating film surrounding a side surface of the light emitting element core and a side surface of the element electrode layer, wherein the first semiconductor layer, the element active layer, and the second semiconductor layer are sequentially disposed in the direction the light emitting element core extends, the element electrode layer overlaps the second semiconductor layer in the direction the light emitting element core extends, an area of the element electrode layer in plan view is smaller than an area of the second semiconductor layer in plan view, the element insulating film completely exposes a surface of the element electrode layer, the surface being opposite to another surface of the element electrode layer facing the second semiconductor layer, and the element insulating film exposes only a portion of the side surface of the element electrode layer.

17. The display device of claim 16, wherein the area of the element electrode layer in plan view is in a range of 75% to 95% of the area of the second semiconductor layer in plan view.

18. The display device of claim 17, wherein the element insulating film surrounding the element electrode layer has an outer peripheral surface inclined with respect to the direction the light emitting element core extends.

19. The display device of claim 18, wherein an inclination angle of the outer peripheral surface of the element insulating film surrounding the element electrode layer is in a range of 60° or less.

20. A display device comprising:

a first electrode and a second electrode that are disposed on a substrate and spaced apart from each other; and a light emitting element disposed between the first electrode and the second electrode, the light emitting element including:

a light emitting element core extending in a direction and including:

a first semiconductor layer;

a second semiconductor layer disposed on the first semiconductor layer; and an element active layer disposed between the first semiconductor layer and the second semiconductor layer;

an element electrode layer disposed on the second semiconductor layer of the light emitting element core; and an element insulating film including:

a first region surrounding a side surface of the light emitting element core; and a second region surrounding a side surface of the element electrode layer, wherein the second region of the element insulating film includes an outer peripheral surface inclined with respect to the direction the light emitting element core extends, and an inclination angle of the outer peripheral surface of the second region of the element insulating film is in a range of 60° or less.

* * * * *